(12) United States Patent
Pickerd et al.

(10) Patent No.: US 10,432,434 B2
(45) Date of Patent: Oct. 1, 2019

(54) MULTI-BAND NOISE REDUCTION SYSTEMS AND METHODS

(71) Applicant: TEKTRONIX, INC., Beaverton, OR (US)

(72) Inventors: John J. Pickerd, Hillsboro, OR (US); Kan Tan, Portland, OR (US); Pirooz Hojabri, San Jose, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/617,143

(22) Filed: Jun. 8, 2017

(65) Prior Publication Data

US 2018/0026816 A1    Jan. 25, 2018

Related U.S. Application Data

(60) Provisional application No. 62/364,571, filed on Jul. 20, 2016.

(51) Int. Cl.
  *H04L 25/03*  (2006.01)
  *H04B 15/00*  (2006.01)
  (Continued)

(52) U.S. Cl.
  CPC ........ *H04L 25/03828* (2013.01); *G01R 19/25* (2013.01); *H04B 15/00* (2013.01); *G01R 13/0218* (2013.01); *H03M 1/12* (2013.01)

(58) Field of Classification Search
  CPC .............................................. H04L 25/03828
  (Continued)

(56) References Cited

U.S. PATENT DOCUMENTS

| | | |
|---|---|---|
| 5,185,806 A | 2/1993 | Dolby |
| 5,412,690 A | 5/1995 | Kotzin |

(Continued)

FOREIGN PATENT DOCUMENTS

| | | |
|---|---|---|
| EP | 0583968 | 2/1994 |
| EP | 1190522 | 3/2002 |

(Continued)

OTHER PUBLICATIONS

Sadhu Bodhisatwa et al, "Building an On-Chip Spectrum Sensor for Cognitive Radios", IEEE Communication Magazine, Apr. 2014, pp. 92-100, vol. 52 No. 4, Piscataway, US.

(Continued)

*Primary Examiner* — Lihong Yu
(74) *Attorney, Agent, or Firm* — Miller Nash Graham & Dunn; Andrew J. Harrington

(57) ABSTRACT

Systems and methods directed towards reducing noise introduced into a signal when processing the signal are discussed herein. In embodiments a signal may initially be split by a multiplexer into two or more frequency bands. Each of the frequency bands can then be forwarded through an assigned channel. One or more channels may include an amplifier to independently boost the signal band assigned to that channel prior to a noise source within the assigned channel. This results in boosting the signal band relative to noise introduced by the noise source. In some embodiments, a filter may also be implemented in one or more of the channels to remove noise from the channel that is outside the bandwidth of the signal band assigned to that channel. Additional embodiments may be described and/or claimed herein.

20 Claims, 19 Drawing Sheets

(51) Int. Cl.
*G01R 19/25* (2006.01)
*G01R 13/02* (2006.01)
*H03M 1/12* (2006.01)

(58) Field of Classification Search
USPC ........................................................ 375/232
See application file for complete search history.

(56) References Cited

U.S. PATENT DOCUMENTS

| | | | | |
|---|---|---|---|---|
| 6,668,027 | B1 * | 12/2003 | Scarpa | H04B 1/0003 |
| | | | | 375/345 |
| 7,792,513 | B2 | 9/2010 | Safarian | |
| 7,957,938 | B2 | 6/2011 | LaMarche | |
| 8,160,527 | B2 | 4/2012 | Jonsson | |
| 8,917,197 | B2 | 12/2014 | Kanter | |
| 2005/0147192 | A1 * | 7/2005 | Yamamoto | H03G 3/3052 |
| | | | | 375/345 |
| 2009/0291658 | A1 | 11/2009 | Castle | |
| 2010/0248660 | A1 * | 9/2010 | Bavisi | H04B 1/0458 |
| | | | | 455/120 |
| 2013/0251078 | A1 * | 9/2013 | Bachl | H03G 3/3073 |
| | | | | 375/345 |
| 2015/0153408 | A1 * | 6/2015 | Otaka | G01R 31/311 |
| | | | | 324/754.23 |

FOREIGN PATENT DOCUMENTS

| | | |
|---|---|---|
| EP | 2853902 | 1/2015 |
| EP | 2908439 | 8/2015 |
| JP | 2001308730 | 11/2001 |

OTHER PUBLICATIONS

EESR—European Patent Office, Extended European Search Report and Written Opinion for European Patent Application No. 17182426.1, dated Dec. 14, 2017, 14 pages. Munich, Germany.

* cited by examiner

US 10,432,434 B2

MULTI-BAND NOISE REDUCTION SYSTEMS AND METHODS

CROSS-REFERENCES TO RELATED APPLICATIONS

The present application claims benefit from U.S. Provisional Patent Application Ser. No. 62/364,571, filed Jul. 20, 2016 by John J. Pickerd et al., and entitled "Biamp CTLE Test Instrument Noise Reduction System," which is incorporated herein by reference as if reproduced in its entirety.

FIELD OF THE INVENTION

This disclosure is directed to systems and methods associated with noise reduction, and, more particularly, to systems and methods for reducing noise utilizing multiple frequency bands.

BACKGROUND

Digitizing systems are designed to process an analog signal to produce a digitized representation of the analog signal as a digital signal. In performing this processing, a digitizing system can introduce unwanted noise into the resulting digital signal, which causes the resulting digital signal to inaccurately represent the original analog signal. While this noise may be reduced somewhat through the use of better engineering design practices or higher quality components and/or materials, under the current state of the art there can still be issues with the amount of noise introduced by even high quality digitizing systems. This can be especially problematic in areas such as, for example, digital test and measurement systems, which engineers rely on to measure highly accurate representations of analog signals. In some instances, certain frequencies (e.g., high frequencies) can even be lost in the noise floor of such a test and measurement system. As such, the amount of noise introduced by a digitizing system can be a concern.

Embodiments of the invention address these and other issues.

DETAILED DESCRIPTION

Figure 1:
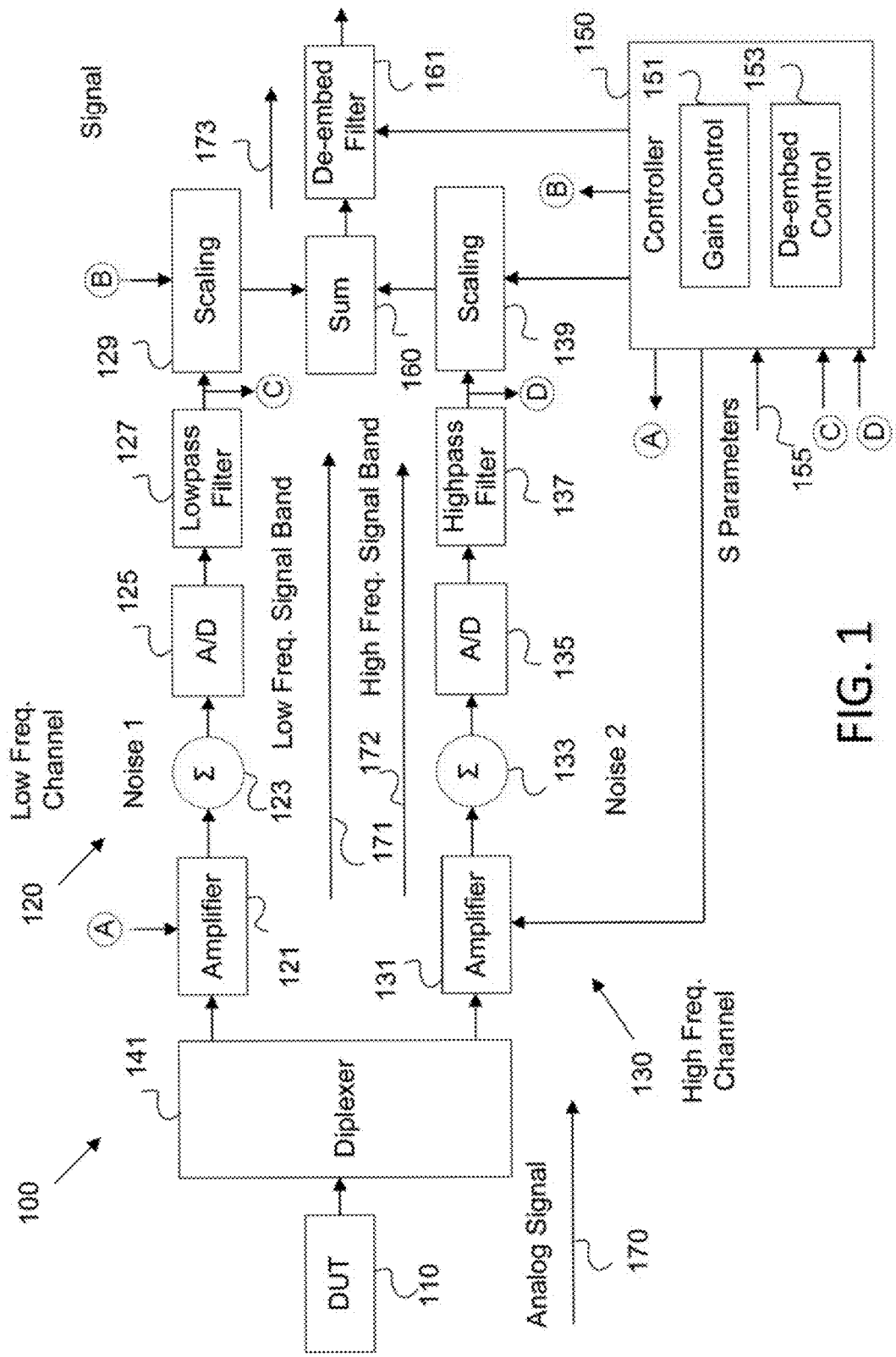
FIG. 1 is an illustrative block diagram of a test and measurement system that employs noise reduction in accordance with various aspects of the present disclosure.

Disclosed herein is a noise reduction system configured to split input signals based on frequency into two or more channels, such as a high frequency channel and a low frequency channel. Each channel can then be modified independently to control for noise within the channel. The input signals may be single signals or differential signals. The input signals may be split based on frequency, for example, by employing a multiplexer (e.g. a diplexer, triplexer, etc.). As used herein, a multiplexer refers to a multiband splitter that is capable of splitting a signal into more than one frequency band. In some embodiments, differential inputs are converted into a single signal prior to applying the multiplexer by employing a balun. The input signals can be amplified prior to reaching certain noise inducing components, such as, for example, a digitizer of an electronic system (e.g., a test and measurement system). As such, the noise introduced into the amplified signal by these certain noise inducing components is reduced as compared with the unamplified signal. The signals are then converted from analog signals into digital signals via an analog to digital (A/D) converter prior to being scaled to remove an effect of the amplifier from the digital signals and recombined into a common signal for display, or other processing. As the signals are split based on frequency, a highpass filter can be applied to the high frequency channel to remove low frequency noise from the high frequency channel without affecting the low frequency signals in the low frequency channel. Further, a lowpass filter can be applied in the low frequency channel to remove high frequency noise from the low frequency channel without affecting the high frequency signals in the high frequency channel. As such, noise introduced into a frequency channel that is outside the frequency band being processed by that channel can be reduced, or even eliminated. Splitting the signal into multiple channels can allow for significant improvement in noise reduction, because each channel can be adjusted independently based on the portion of the signal being processed therein. In addition, the amplification can be modified at run time, or in real time, to independently optimize, or increase, signal to noise ratio (SNR) of each channel. For example, the signal can be amplified prior to the addition of channel noise resulting in a reduction of the amount of channel noise relative to the signal. Accordingly, the gain of the amplifier can be increased until the signal (e.g., the low frequency signal or the high frequency signal) is amplified to within a threshold of the capability of the A/D converter (e.g. eighty percent) to maximize amplification of the signal and corresponding SNR reduction without causing signal clipping at the A/D converter. The test and measurement system may also employ serial data link analysis (SDLA) and scattering (S) parameters to de-embed the effects of the measurement system components on a per channel basis from the input signals before such signals are combined and output to the user (e.g., via a display), or for additional processing.

FIG. 1 is a block diagram of an embodiment of a test and measurement system 100 for noise reduction. The system 100, as depicted, can include multiple independently controlled amplifiers (e.g., amplifiers 121 and 131) that act on different frequency bands of a signal 170. While depicted as being a finite number of frequency bands in the figures, it will be appreciated that the present disclosure is applicable to any number of frequency bands greater than one. In various embodiments, these independently controlled amplifiers can be configured to act on signal 170 in a manner similar to a continuous time linear equalizer (CTLE). In such embodiments, system 100 may be considered a multi-band CTLE test instrument noise reduction system. The system 100 includes a low frequency channel 120 and a high frequency channel 130. In some embodiments, only a subset of the frequency channels may include independently controlled amplifiers. For example, high frequency channel 130 could include an amplifier, as depicted, while low frequency channel 120 might omit an amplifier. This could be beneficial, for example, if noise in the one channel is of less concern than noise in one or more other channels. In the depicted embodiment, however, the low frequency channel 120 includes an adjustable amplifier 121 positioned prior to a noise source 123, an A/D converter 125, a lowpass filter 127 and an adjustable scaling component 129. The high frequency channel 130 includes an adjustable amplifier 131 positioned prior to a noise source 133, an A/D converter 135, a highpass filter 137 and a scaling component 139. The system 100 also includes a diplexer 141 for splitting a signal 170 from a DUT 110 into different frequency bands for transmission across the channels 120 and 130. The system also includes a controller 150 configured to control the amplifiers 121 and 131 as well as the scaling components 129 and 139. The controller can be configured to control the amplifiers, or any other components, automatically (i.e., without input by a user/human), in accordance with settings input by a user (e.g., via user controls), or in some combination thereof. The controller 150 can also control a de-embed filter 161 for removing the effects of system 100 components, or a subset thereof, from the signal 170 from the DUT 110 prior to display to a user. For example, de-embed filter could act as an inverse filter to remove an effect of one of the amplifiers (e.g., in accordance with control signals from controller 151.

The DUT 110 may be any signal source configured to communicate via electrical signals. Signal 170 may be any signal or signals transmitted by the DUT 110. For example, the DUT 110 may include a transmitter (Tx) configured to transmit signals over an electrically conductive medium. In some cases, the DUT 110 is a device designed to transmit signals to a corresponding receiver (not shown). The DUT 110 may be coupled to system 100 for testing purposes, for example when the DUT 110 is believed to be engaged in transmitting faulty signals and/or for verification of signaling accuracy for a newly designed DUT 110. The DUT 110 is connected to the diplexer 141 via a DUT link, which may be any electrically conductive medium capable of communicating signals from the DUT 110 to the diplexer 141. For example, the DUT link may employ electrically conductive wire, signal probes, intervening test equipment, etc. In some instances, the DUT link may cause an attenuation of frequencies within signal 170. In such instances, the frequency shape of one or more of the amplifiers may be selected in an effort to mitigate, or reduce, the attenuation.

The diplexer 141 can be a passive device that implements frequency domain multiplexing. The diplexer 141 is a type of multiplexer that converts a signal 170 with a broad range of frequencies into two signal bands with mutually exclusive frequency ranges. In some embodiments, diplexer 141, or any other multiplexer discussed herein, can be implemented utilizing a splitter and appropriate frequency filters, e.g., high pass filter for a high frequency channel, low pass filter for a low frequency channel, and one or more bandpass filters for middle frequency channels. It will be appreciated that other configurations of a multiplexer are contemplated and this disclosure should not be limited based on how the splitting of a signal (e.g., signal 170) into multiple frequency bands is accomplished. As depicted, the diplexer 141 converts signal 170 received from the DUT 110 into a high frequency signal band 172 and a low frequency signal band 171 for transmission to the high frequency channel 130 and the low frequency channel 120, respectively. The high frequency signal band 172 employs different frequency bounds (e.g., a different frequency range) than the low frequency signal band 171. The diplexer 141 is configured with a cross-over frequency. Signal bands 172 with frequencies above the cross-over frequency are forwarded to the high frequency channel 130 and signal bands 171 with frequencies below the cross-over frequency are forwarded to the low frequency channel 120. Accordingly, high frequency signal band 172 is a band of signal 170 that contains all waveforms with frequencies above the diplexer cross-over frequency, and low frequency signal band 171 is a band of signal 170 that contains all waveforms with frequencies below the diplexer cross-over frequency, respectively. It should be noted that, while system 100 depicts two frequency channels, three or more frequency channels may be employed in some embodiments (e.g. a high frequency channel, one or more mid-frequency channels, and a low frequency channel, etc.) In such cases, the diplexer 141 may be substituted with a triplexer or higher order multiplexer without departing from the present disclosure. Such a multiplexer employs multiple cross-over frequencies (e.g. a low frequency cross-over and a high frequency cross-over) to sort the signal bands into corresponding frequency channels as desired.

The low frequency channel 120 includes the amplifier 121 coupled with an output of diplexer 141. As used herein any indication of coupling two components together (e.g., coupled with, coupled to, connected with, connected to, etc.) can refer to a direct coupling (i.e., with no intermediate components) or an indirect coupling (i.e., with one or more components in between). An amplifier is any component configured to increase the power of a signal. Increases in signal power attributed to an amplifier may be referred to as signal gain. Accordingly, the amplifier 121 is configured to provide a signal gain to the low frequency signal band 171. The gain provided by the amplifier 121 is adjustable. The amplifier 121 is communicatively coupled to the controller 150 as shown by label A. As such, the amplifier 121 is adjustable based on commands, or signals, from controller 150. The amplifier 131 is coupled with another output of diplexer 141. The amplifier 131 provides adjustable signal gain to high frequency signal band 172. The amplifier 131 is also adjustable based on commands, or signals, from the controller 150.

The signal channels can include multiple noise sources. The noise sources for the low frequency channel 120 and the high frequency channel 130 are depicted as noise source 123 and 133, respectively. Noise from the noise sources 123 and 133 can be generated in the signal channels by any number of components for signal conditioning, such as probe filters, temperature compensation filters, bandwidth extension (BWE) phase and magnitude correction filters, non-linear distortion correction filters, Multiple Input Multiple Output (MIMO) interleave spur correction filters, interpolation filters, averaging filters, conditioning circuits, amplifiers, samplers, phase reference circuits, clock circuits, etc. While depicted as being separate from noise sources 123 and 133, it will be appreciated that the depicted components, such as A/D's 125 and 135, can be included as part of noise sources 123 and 133. The noise from noise sources 123 and 133 can reduce the SNR of the signal bands 171 and 172, respectively, unless measures are taken to compensate for the noise. Further complicating system 100, noise 123 and noise 133 may include different Root Mean Square (RMS) amplitude values. For example, the diplexer 141 passes the low frequency band 171 of the signal thru amplifier 121. Then noise source 123 may add full bandwidth noise to the low frequency band 171. For example, in some cases, the RMS amplitude of the noise 123 might be 5.7 Millivolt Root Mean Square (mVrms). Further, the diplexer 141 passes the high frequency band 172 of the signal through amplifier 131. Noise source 133 may then add only 1 mVrms of noise to the high frequency band 172. This is because the noise of an oscilloscope may vary with the gain setting of the channel. For example, the low frequency channel 120, might operate at 100 Millivolts per division (mV/div), while the high frequency channel might operate at 6.25 mV/div. When a single signal, such as a pseudorandom binary sequence (PRBS) data pattern, with multiple frequencies traverses a signal channel, the low frequencies are typically large in amplitude and the high frequencies are typically small in amplitude. Thus SNR of the low frequencies is greater than the SNR of the high frequencies as they approach the amplitudes of the noise floor. However, by splitting the signal 170 into a low frequency signal band 171 and a high frequency signal band 172, noise can be removed as discussed below, which can result in significant noise reduction. In some embodiments, an overall signal channel noise reduction of between 5.8 decibels (dB) and 7 dB can be achieved in comparison to a single signal channel.

The low frequency channel 120 includes the A/D converter 125. The A/D converter 125 is a sampling component configured to convert the low frequency signal band 171 from an analog format into a digital format. The A/D converter 125 contains a maximum conversion capability. A maximum conversion capability is the maximum amplitude of an analog signal that the A/D converter 125 can convert into a corresponding digital signal. All analog signal amplitudes in excess of the A/D converter's 125 maximum conversion capability are expressed as a single maximum value in the digital signal. This reduction to a single maximum value may be referred to as clipping and may result in loss of data from the analog signal. As such, the amplifier 121 may be set by the controller 150 to prevent boosting signal gain to a value in excess of the A/D converter's 125 maximum conversion capability. For example, the amplifier 121 may, in some aspects, be set to provide low frequency signal band 171 with an amplitude of about eighty percent of the A/D converter's 125 maximum conversion capability. As the amplitude of the signal band 171 may not be known in advance, the remaining about twenty percent may be reserved to allow for signal variance with little chance of clipping. The reserved portion of the A/D converter's 125 maximum conversion capability may be referred to as headroom for signal variance. The A/D converter 135 may be substantially similar to A/D converter 125, and may perform analog to digital conversion for the high frequency signal band 172 in the high frequency channel 130.

The low frequency channel 120 also includes an optional lowpass filter 127. The lowpass filter 127 is any filter configured to remove higher frequency waves (e.g., waves with a frequency greater than a crossover frequency of the diplexer) from a signal while leaving lower frequency waves (e.g., waves with a frequency less than the crossover frequency) unchanged. The crossover frequency can be a fixed value determined by the diplexer 141. A diplexer 141 with variable crossover frequency can add another degree of control over the SNR, by enabling the crossover frequency, or frequencies, to vary based on aspects (e.g., frequency range) of signal 170. Such a variable crossover frequency could be controlled manually through user input, automatically (e.g., via commands, or signals, received from controller 150), or in any combination thereof. In the depicted embodiment, diplexer 141 ensures that the low frequency channel 120 includes only the low frequency signal band 171. Hence, any high frequency waves (e.g., those waves with a frequency higher than the crossover) that are present in the low frequency signal band 171 can be considered to be noise that has been added by noise source 123 and can be filtered out. As such, lowpass filter 127 removes these high frequency waves from the low frequency signal band 171, which can result in significant noise reduction. The lowpass filter 127 cutoff frequency can be set based on the diplexer 141 crossover. In some embodiments, the lowpass filter 127 cutoff may be set at a frequency slightly higher (e.g., within a predetermined percentage or range) than the crossover frequency of the diplexer 141.

Highpass filter 137 is similar to lowpass filter 137, but is optionally included in high frequency channel 130 to remove low frequency noise from the high frequency signal band 172. Highpass filter 137 is a filter configured to remove low frequency waves (e.g., waves with a frequency less than a crossover frequency of the diplexer 141) from a signal while leaving waves with a higher frequency (e.g., waves with a frequency greater than the crossover frequency) unchanged. The highpass filter 137 cutoff frequency can be set based on the diplexer 141 crossover. In some embodiments, the highpass filter 137 cutoff may be set at a frequency slightly lower (e.g., within a predetermined percentage or range) than the crossover frequency of the diplexer 141. Any low frequency waves in the high frequency channel 130 can be considered noise added by noise source 133 and can be filtered out. As such, the highpass filter 137 removes noise from the high frequency signal band 172, resulting in significant noise reduction. It should be noted that applying a lowpass filter 127 or a highpass filter 137 directly to signal 170 would filter out bands of the signal 170 along with any noise. Accordingly, splitting the signal 170 into both the low frequency signal band 171 and the high frequency signal band 172 allows for application of the filters and removal of significant signal noise applied by the signal channels.

The low frequency channel 120 also includes the scaling component 129 and high frequency channel 130 also includes scaling component 139. In some instances, a scaling component can refer to any component configured to convert binary data from an input signal into units of volts. Scaling component 129 and 139 can be adjustable. The scaling components 129 and 139 can be coupled with the controller 150 as depicted by label B. The scaling components can be adjusted by controller 150 programmatically. In some instances, the controller 150 can be configured to adjust scaling component 129 based on the amount of gain applied to the low frequency signal band, such that scaling component 129 acts as an inverse filter. In such a configuration, the scaling component can have an inverse frequency response to the respective amplifier. Similarly, the controller 150 (e.g., de-embed control module 153) can also be configured to adjust scaling component 139 based on the amount of gain applied to the high frequency signal band. In such instances, the controller can effectively control scaling components 129 and 139 to cause a ratio between the low frequency signal band and the high frequency signal band to return to a same, or similar, ratio as that of the low frequency signal band and the high frequency signal band prior to amplification. By amplifying each frequency band of the signal prior to noise sources 123 and 133, the portion of the signal included in the frequency bands is amplified relative to the noise sources. Subsequent scaling by the scaling components can reverse the scaling applied to each frequency band, thus reducing each frequency band back to an original level, while reducing the noise introduced in the interim (e.g., between the amplifier and scaling component) in a corresponding amount. This configuration can result in a greater reduction of noise than if the signal were processed as a whole, because the amount of amplification and/or the frequency response shape of the amplifier can be independently tailored to the portion of the signal included in each of the frequency bands.

In some instances, channels 120 and 130 can be configured for different sampling rates. In such instances, the low frequency channel 120 and/or high frequency channel 130 may also include an interpolation block, which can be applied before the bands 171 and 172 are recombined as discussed below. In such instances, samples captured in the low frequency channel and the samples captured in the high frequency channel may not align due to the variation in sampling rates. As such, the interpolation block may perform interpolation on the low frequency signal band 171 to match the low frequency signal band 171 samples to the samples of the high frequency signal band 172, or vice versa.

Other conversion blocks may also be employed to match the bands 171 and 172 for recombination. For example, a timing synchronization block may be applied to the low frequency signal band 171 after the interpolation block. The timing synchronization block may be employed to match the bands 171 and 172 when multiple test and measurement instruments are employed for the channels 120 and 130, and when the test and measurement instruments employ sample clocks that are not synchronized. The timing synchronization block may compute the phase response of each band 171 and 172. The timing synchronization block may also determine a group delay time to cause the phase of the high frequency band 172 to be continuous with the phase of the low frequency band 171. The timing synchronization block may also compute a Finite Impulse Response (FIR) filter with the determined group delay. The timing synchronization block may also apply an allpass filter to the band used as a reference in order to align the bands 171 and 172 for recombination. As another example, unit conversion blocks may be employed to match the bands 171 and 172. A unit conversion block may convert acquired waveform data from binary numbers into floating point numbers and vice versa.

After traversing the scaling components 129 and 139, the low frequency signal band 129 and the high frequency signal band 139 can be matched, or time aligned, and recombined into output signal 173 by a sum block 160. A sum block 160 is any circuit, component, and/or process configured to combine a plurality of signal components into a complete signal. For example, a sum block 160 may be a software process that continuously combines the output of scaling component 129 with the output of scaling component 139. As another example, sum block 160 could be another multiplexer acting in reverse of the splitting multiplexer discussed above. Accordingly, the low frequency band 171 and the high frequency band 172 are combined into output signal 173, as used in this context it will be appreciated that output signal 173 output by system 100 is a digital representation of the analog signal 170 input to system 100.

A de-embed filter 161 is applied to the recombined signal 170 to de-embed effects of the system 100 components from the output signal 173. A de-embed filter 161 can include a filter that removes known phase and magnitude changes made by system 100 components, for example by employing scatter (S)-parameters that mathematically describe the phase and magnitude effects caused by corresponding components. For example, the S-parameters may account for known electrical imperfections in the components of system 100 and may be employed to account for such imperfections. The de-embed filter 161 is controlled/applied by the controller 150 by employing a de-embed control module 153. In some embodiments, de-embed control module 153 can utilize serial data link analysis (SDLA) to determine one or more correction filters to apply, via de-embed filter 161, to output signal 173. Other mechanisms may be used for computing the de-embed filter 161, such as Signal Correct which uses step stimulus from a reference step and an actual step. Specifically, Signal Correct is a process that passes a known step waveform through a signal channel to obtain a Time Domain Transmission (TDT) reference step waveform. The reference step may or may not also consider waveform reflections resulting in a Time Domain Reflection (TDR) step waveform. A known step waveform is then passed through both signal channels and the diplexer 141 to obtain an actual step waveform. The TDT/TDR reference step waveform and the actual step waveform may be employed to calculate the de-embed filter 161. In some aspects, the TDT/TDR reference step waveform and the actual step waveform may be employed as part of SDLA, for example by calculating S-parameters from the TDT/TDR reference step waveform and the actual step waveform.

While depicted as being after sum block 160, it will be appreciated that, in some embodiments, each of the channels of system 100 (e.g., low frequency channel 120 and high frequency channel 130) could have individual de-embed filters included therein (e.g., between scaling component 129 and sum block 160, or as part of scaling component 129).

The controller 150 is any component configured to set the gain and/or frequency shape for the amplifiers 121 and 131, control application of the de-embed filter 161, or control any other aspects discussed herein as capable of being controlled by a controller. The controller 150 may contain inputs for receiving signal bands from the channels 120 and 130 as well as processor(s) and/or modules for controlling the amplifiers/scaling components, as well as other components. For example, as depicted, controller 150 may contain a gain control module 151 implemented (e.g., via executable instructions) on a processor. The gain control module 151 is configured to receive outputs from the lowpass filter 127 and the highpass filter 137 via connections labeled C and D, respectively. The gain control module 151 can then set the gain boost for the amplifier 121 based on the received output from the lowpass filter 127. Further, the gain control module 151 can set the gain boost for the amplifier 131 based on the received output from the highpass filter 137. The gain boost for the low frequency channel 120 can be set independently of the gain boost for the high frequency channel 130, and vice versa. The controller 150 may also contain the previously mentioned de-embed control module 153, implemented (e.g., via executable instructions) on one or more processor(s), for de-embedding, for example, channel based phase and magnitude effects from the waveform prior to display to a user, or output for additional processing. For example, the de-embed control module 153 may receive S-parameters 155. The S-parameters 155 may describe phase and magnitude changes caused by particular components. The S-parameters 155 may include S-parameters for the DUT 110 and associated link, the S-parameters for the diplexer 141, S-parameters for one or more components of the low frequency channel 120, and/or the S-parameters for one or more components of the high frequency channel 130. The de-embed control module 153 may employ the S-parameters 155 to approximate the phase and magnitude changes caused by the corresponding components and control de-embed filter 161 to remove such approximate effects to further reduce signal noise. The S-parameters 155 may be received from a user, received from a network component, received from memory, received from the component, etc.

While the amplifiers are depicted as being integrated with system 100, it will be appreciated that, in some configurations, the amplifiers could be implemented outside system 100. In such a configuration, the amplifiers could be communicatively coupled with controller 150 (e.g., via a wired communication channel, a wireless communication channel, or a combination thereof) to enable controller 150 to output a control signal or commands to the amplifiers. In addition, the amplifiers could be configured to provide de-embed parameters (e.g., s-parameters, frequency response parameters, etc.) for the amplifiers to controller 150 to enable controller 150 to effectuate de-embedding of the amplifiers (e.g., via de-embed filter 161 or scaling components 129 or 139).

As noted above, the controller 150 includes inputs labeled as C and D. Accordingly, the controller 150 includes a first input configured to receive a first frequency band of the signal 170, which may be a low frequency signal band 171. The first frequency band may be received from a diplexer 141 via a first frequency channel such as low frequency channel 120. The first frequency band may also be received via a filter such as the lowpass filter 127. The controller 150 also includes a second input configured to receive a second frequency band of the signal 170, such as high frequency signal band 172, from the diplexer 141. The second frequency band may also be received via a second frequency channel, such as high frequency channel 130 and via a filter such as the highpass filter 137. The controller 150 contains a processor coupled to the first input and the second input. The processor is configured to operate the gain control 151 module to set a first gain boost of an adjustable amplifier 121 for the first frequency channel (e.g. channel 120). Such settings are selected based on the received first frequency band of the signal 170 (e.g. band 171) output from the lowpass filter 127, or A/D 125 if lowpass filter 127 is omitted. The processor is further configured to set a second gain boost of amplifier 131 for the second frequency channel (e.g. channel 130). Such settings are selected based on the received second frequency band (e.g. band 172) of the signal 170 output from the highpass filter 137, or A/D 135 if highpass filter 137 is omitted. The gain boosts for the first frequency channel are set independently of the gain boosts for the second frequency channel. By employing the lowpass filter 127 and the highpass filter 137, channel noise (e.g. at noise sources 123 and 133) added to the signal 170 is removed from the signal bands (e.g. bands 171 and 172), as described elsewhere herein, reducing overall signal noise. The crossover frequency of the diplexer 141 determines the frequency bounds for the low frequency channel 120 and the high frequency channel 130.

The gain boost for amplifier 121 is selected and set, or adjusted, by the controller 150. The settings, or adjustments, of the gain boost of amplifier 121 can be selected based on an SNR of the first frequency band of the signal 170 (e.g. band 171) attainable without clipping in the first frequency channel by the A/D 125. In some instances the first gain boost could initially be set to be equivalent to the gain boost that was most recently applied by amplifier 121 and then could be updated to achieve a desired, or optimized, SNR. Such an initial setting could be stored in controller 150 or amplifier 121.

The second gain boost for amplifier 131 is selected and set, or adjusted, by the controller 150. The settings, or adjustments, of the gain boost of amplifier 131 can be selected based on an SNR of the second frequency band of the signal 170 (e.g. band 172) attainable without clipping in the second frequency channel by the A/D 135. The de-embed control module 153 can employ S-parameters 155 to control the de-embed filter 161 to de-embed, from the signal 170, effects of amplifier 121 and amplifier 131.

In some aspects, the amplifiers may have a peaked frequency response, or may be controlled by controller 150 to have such a frequency response. Such a peaked frequency response can have a positive gain slope. The peaking can be selected (e.g., by controller 150) to be substantial, e.g., greater than 5 decibels (dB), or more than 10 dB, or more, in an effort to increase the SNR of the frequency band being processed. As such, the selected peaking can be much more than is necessary to compensate for losses or attenuation in system 100. For example, a 20 dB boost can improve the SNR of the resulting signal by approximately 12 dB. The result of this peaking is that the frequency band processed by a respective A/D converter may be very different from that of the same frequency band of the input signal. In fact, it can be intentionally distorted, and thus may require digital post-processing to compensate for that. In other aspects, as discussed elsewhere herein, the frequency response can be dynamically adjusted based on the limits of A/D converter, as such, the amount of peaking can be dependent on the A/D converter of the channel. In addition, or alternatively, the peaking can be dependent on the frequency band of the signal being processed by the channel, because the amplitude of frequencies within the signal being processed could impact the amount of peaking that can be applied within the bounds of the A/D converter. This peaking can be intentionally selected to address noise within the frequency band being processed by the channel. In some instances, the peaking may be selectable by a user of system 100 or can be automatically controlled by controller 150.

System 100 can be particularly effective when the DUT 110 communicates over a lossy channel. When signal 170 is lossy (e.g. experiences high frequency amplitude losses such as −20 dB, −37 dB, −47 dB, etc.) as in some serial data standards, the signal 170 may not retain high amplitude data in the high frequency signal band 172. When a lossy signal is processed by system 100, noise reduction can be increased dramatically. The overall noise reduction may be related to the cross-over frequency of the diplexer 141. For example, a higher cross-over frequency with respect to channel bandwidth may result in larger possible noise reduction.

It should also be noted that system 100 may be implemented with different channels having different sample rates, bandwidths, vertical gain ranges, A/D number of bits, etc. Accordingly, in some embodiments, a first test and measurement instrument can be chosen for the low frequency channel 120 based on characteristics of the low frequency signal band 171, while a second test and measurement instrument can be chosen for the high frequency channel 130 based on characteristics of the high frequency signal band 172. As such, test and measurement instruments, e.g., oscilloscopes, can be selected to independently operate on portions of the same signal 170 to optimize SNR while minimizing costs. It should also be noted that the low frequency channel 120 and the high frequency channel 130 may operate at a different sample rate and/or bandwidth.

Figure 2:
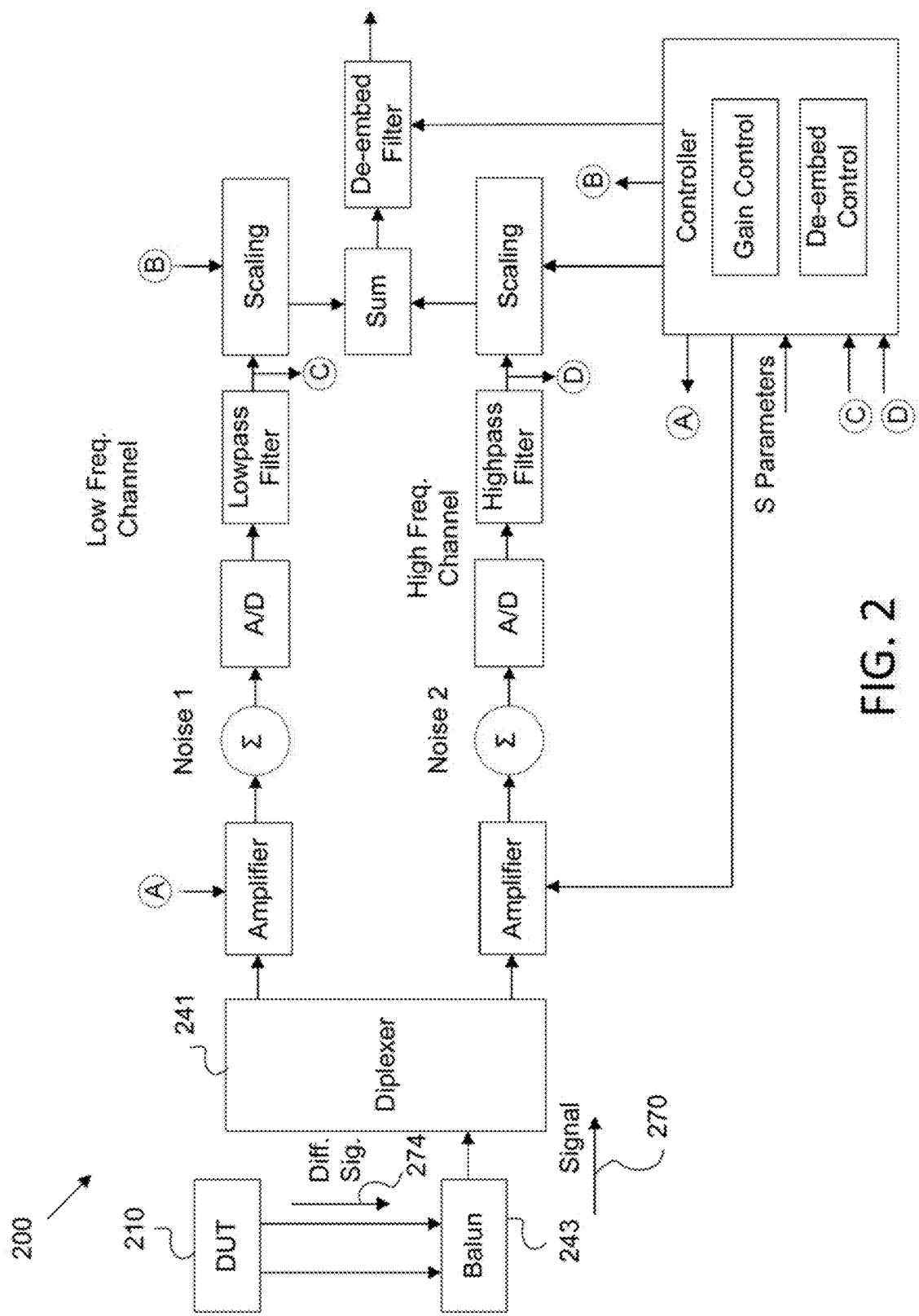
FIG. 2 is an illustrative block diagram of a test and measurement system that employs noise reduction in accordance with various aspects of the present disclosure for a differential signal.

FIG. 2 is a block diagram of an embodiment of a test and measurement system 200 for noise reduction for a differential signal 274. System 200 is substantially similar to system 100 with substantially similar components as shown in FIG. 2. System 200 contains a DUT 210 and a diplexer 241, which are similar to the DUT 110 and the diplexer 141, respectively. However, DUT 210 produces a differential signal 274. A differential signal 274 is a pair of complementary signals, generally referred to as a positive side and a negative side, which are carried in separate conductors and operate together to transmit information. Differential signals, such as differential signal 274, are sometimes used to transmit information in a manner that is resistant to common mode noise. As shown, diplexer 241 contains a single input. Accordingly, the differential signal 274 may be converted into a single signal 270 for input into the diplexer 241. The signal 270 is substantially similar to signal 170 and is processed by the remaining components in a manner substantially similar to the components of system 100.

The system 200 includes a balun 243 to convert the differential signal 274 into the signal 270. A balun 243 is a device configured to convert a balanced signal to an unbalanced signal, and vice versa. A differential signal 274 is a form of balanced signal, and signal 270 is an unbalance signal that contains substantially the same information as the differential signal 274 in a different format. Accordingly, the balun 243 is coupled to the diplexer 241 and converts the differential signal 274 into a single signal 270 for input into the diplexer 241. The signal 270 from the balun 243 is split by the diplexer 241 into the high frequency channel and low frequency channel and eventually received by the controller for use in control of the amplifiers and the scaling components as discussed with respect to system 100. The balun 243 may not be exactly de-embedded by the de-embed control module. For example, the balun 243 combines a signal 274 from two input ports into a single output port. An S-parameter model of such a system may not be directly solvable. However, the balun 243 may be modeled as a two port network, which provides S-parameters that reasonably approximate the characteristics of the balun 243. The S-parameters for the balun 243 may be forwarded to the controller for de-embedding by the de-embed filter and the de-embed control module. The S-parameters for the balun 243 may be employed in addition to/in conjunction with the S-parameters discussed with respect to system 100. It should also be noted that TDT/TDR and actual step waveforms may be employed to generate the de-embed filter for system 200. As a differential signal 274 is employed, a differential signal generator may be employed to generate the TDT/TDR reference, for example by forwarding the signal through both channels and subtracting the results to obtain the TDT/TDR reference.

Figure 3:
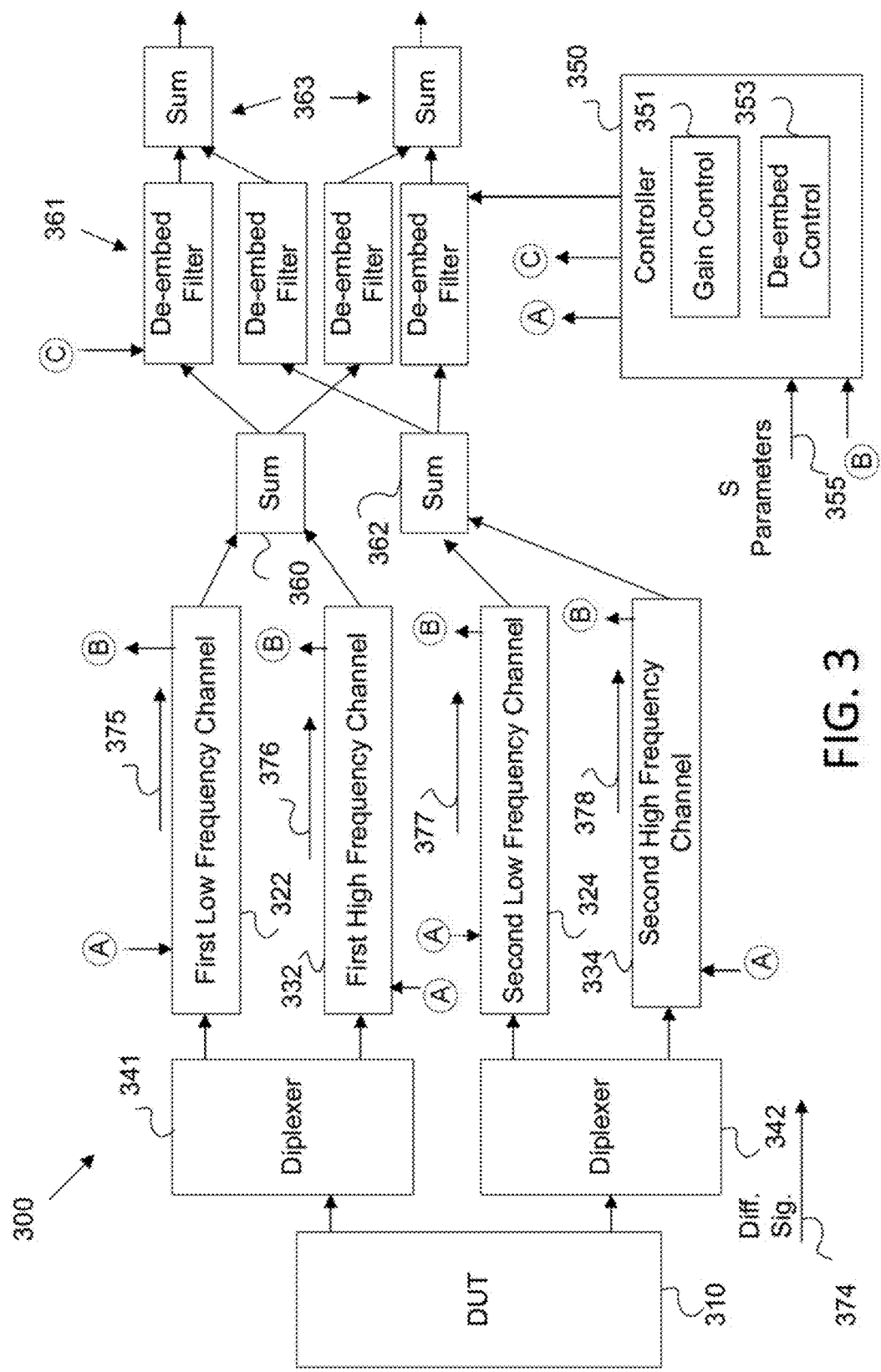
FIG. 3 is another illustrative block diagram of a test and measurement system that employs noise reduction in accordance with various aspects of the present disclosure for a differential signal.

FIG. 3 is a block diagram of an embodiment of a test and measurement system 300 for noise reduction for a differential signal 374 without employing a balun. System 300 includes a DUT 310 which provides a differential signal 374. Such components are substantially similar to DUT 210 and differential signal 274, respectively. As noted above, de-embedding of a balun may be achieved by approximation. System 300 may be employed in the event exact de-embedding is desired. Unlike system 200, the differential signal 374 is retained in differential form and each component of the differential signal 374 is split into frequency bands for independent measurement, or processing, in a manner similar to system 100. System 300 includes diplexers 341 and 342, which are each substantially similar to diplexer 141. The components of the differential signal 374 are each forwarded to the corresponding diplexer 341/342. The differential signal 374 is then split by frequency into signal bands 375 and 377, which are similar to low frequency signal band 171, and signal bands 376 and 378, which are similar to high frequency signal band 172, respectively. It will be appreciated, however, that, in embodiments where diplexers 341/342 have variable crossover points, these points can be controlled (e.g., via controller 350) independently such that the crossover point for diplexer 341 is different from a crossover point for diplexer 342. In such embodiments, the diplexers, or multiplexers, can be controlled by controller 350 to achieve crossover point(s) that enable the SNR of any resulting signal to be increased, or maximized. It will also be appreciated that such a diplexer/multiplexer/controller scheme can be implemented in any of the embodiments disclosed herein.

System 300 may include four channels, such as a first low frequency channel 322, a first high frequency channel 332, a second low frequency channel 324, and a second high frequency channel 334. The first low frequency channel 322 and the second low frequency channel 324, are substantially similar to low frequency channel 120 and contain substantially similar components. The first high frequency channel 332 and the second high frequency channel 334, are substantially similar to high frequency channel 130 and contain substantially similar components. Signal bands 375-378 are forwarded through their respective channels as shown in FIG. 3. The signal bands 375-376 are combined via a sum block 360, which is substantially similar to sum block 160. Further, signal bands 377-378 are combined via a sum block 362, which is also substantially similar to sum block 160. The outputs of sum blocks 360 and 362 correspond with the complementary signals of differential signal 374. The recombined complementary signals are then forwarded through de-embed filters 361 as shown, which are similar to de-embed filter 161. The output from the de-embed filters 361 are then forwarded through summing blocks 363, which are substantially similar to sum block 160.

The system 300 includes a controller 350 with a gain control module 351 and a de-embed control module 353, which are similar to controller 150, gain control module 151, and de-embed control module 153, respectively. Accordingly, the gain control module 351 sets gain for the amplifiers, based on the output of each channel's respective filters (e.g. highpass, lowpass, and/or one or more midband filters). Further, the de-embed control module 353 can receive S-parameters 355, which are substantially similar to S-parameters 155. The S-parameters 355 can model any aspects of the DUT 310, diplexers 341-342, channels 322, 324, 332, and 334, or any components or subset of components thereof. As such, the de-embed control module 353 can direct the de-embed filters 361 and 363, or any scaling components, to de-embed phase and/or magnitude changes applied to each signal band 375-378 by the corresponding channel.

As such, the system 300 employs a first frequency channel, second frequency channel, a third frequency channel, and a fourth frequency channel (e.g. channels 322, 324, 332, and 334, respectively). Each of one or more of the depicted channels includes a corresponding adjustable amplifier, also referred to herein as a channel amplifier, configured to provide a gain boost to a corresponding signal band. Each of the one or more of the depicted channels can also optionally include a corresponding filter to remove noise from outside the corresponding signal band (e.g., a highpass filter used in a high bandwidth channel would remove low bandwidth noise). Further, each of one or more of the depicted channels can include a corresponding scaling component to provide unit conversion to the corresponding signal band, as discussed in greater detail above. Further, the controller is configured to set the gain boost for each channel amplifier independently based on the output from the channel amplifier or the signal output by the corresponding filter, if such a filter is included.

Figure 4:
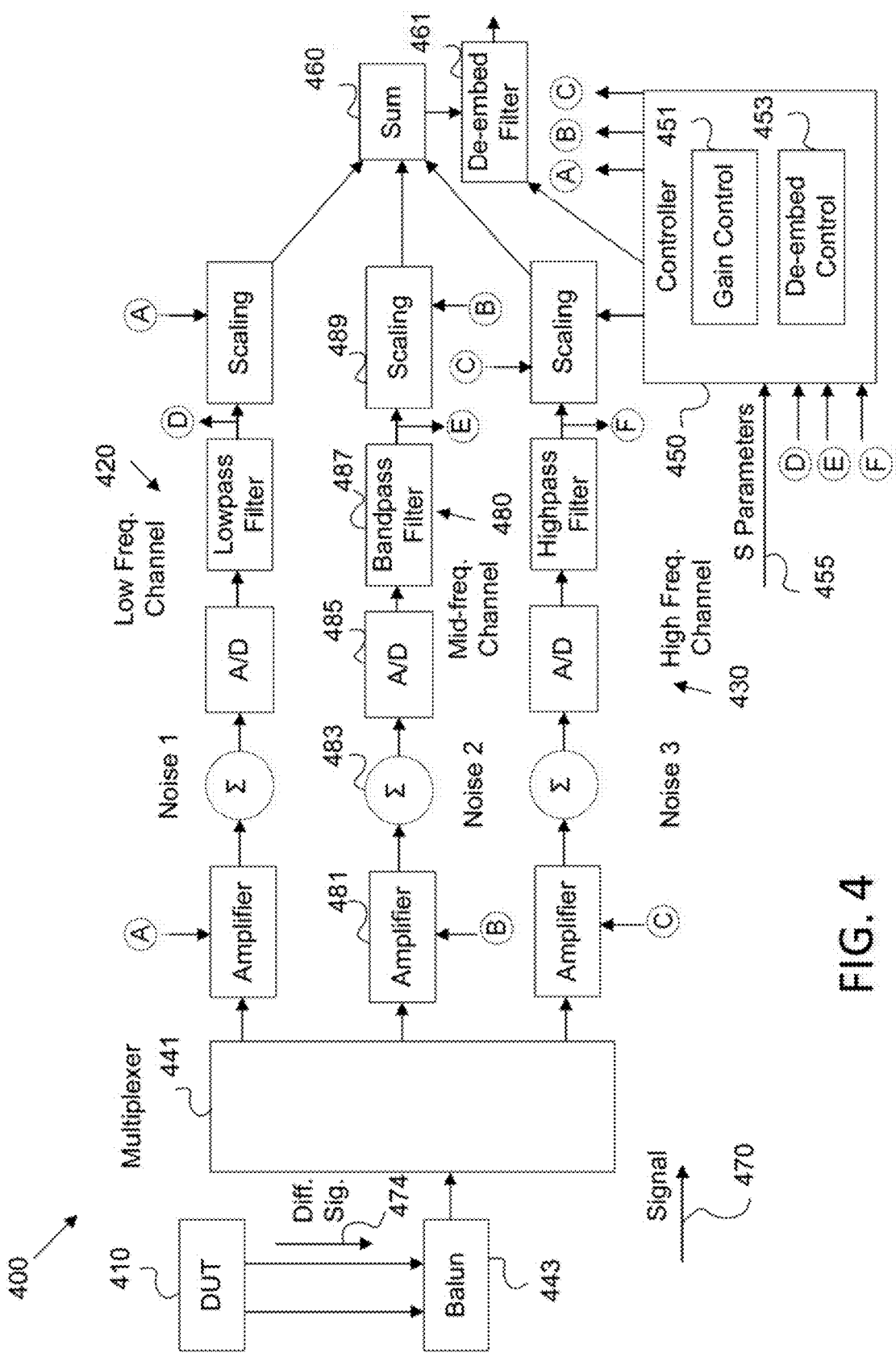
FIG. 4 is another illustrative block diagram of a test and measurement system employing noise reduction in accordance with various aspects of the present disclosure.

FIG. 4 is a block diagram of an embodiment of a test and measurement system 400 for noise reduction employing a mid-frequency channel 480. System 400 is similar to system 100, but is configured to employ a multiplexer 441 to split a signal 470 into a high frequency band, a low frequency band, and a mid-frequency band for separate processing and noise reduction. The mid-frequency signal band has different frequency bounds than the low frequency signal band and the high frequency signal band. While only a single mid-frequency signal band is depicted, it will be appreciated that any number of mid-frequency signal bands can be included without departing from the scope of this disclosure. In configurations having multiple mid-frequency bands, each of the mid-frequency bands can have different frequency bounds from one another. System 400 may include a DUT 410 and a balun 443 for converting a differential signal 474 into a single signal 470 in a manner similar to DUT 210, balun 243, differential signal 274, and signal 270, respectively. In some embodiments, the differential signal 474 and/or balun 443 may be omitted, rendering an embodiment similar to system 100 and/or system 300, respectively. In embodiments, where balun 443 is omitted, but differential signal 474 is included, a similar configuration to that depicted can be utilized to process each side of the differential signal (e.g., the negative side and the positive side) to reduce noise in each side of the differential signal in a manner similar to that utilized to remove noise from a single signal. The resulting individual sides of the differential signal can then be individually measured based on the signal output by the corresponding de-embed filter.

The system 400 includes multiplexer 441. Multiplexer 441 is similar to diplexer 141, but is configured as a triplexer. In a triplexer configuration, multiplexer 441 employs two cross-over frequencies, such as a high frequency crossover point and a low frequency crossover point. Frequencies of signal 470 that are above the high frequency crossover point are forwarded along a high frequency channel 430 as a high frequency signal band, which can be substantially similar to high frequency channel 130 and high frequency signal band 172, respectively. Frequencies of signal 470 that are below the low frequency crossover point are forwarded along a low frequency channel 420 as a low frequency signal band, which can be substantially similar to low frequency channel 120 and low frequency signal band 171, respectively. Frequencies of signal 470 that are between the low frequency crossover point and the high frequency crossover point are forwarded along a mid-frequency channel 480 as a mid-frequency signal band.

The mid-frequency channel 480 can include an amplifier 481, a noise source 483, an A/D converter 485, and a scaling component 489, which are substantially similar to amplifier 121, noise source 123, A/D converter 125, and scaling component 129, respectively. The mid-frequency channel 480 can also contain an optional bandpass filter 487. Bandpass filter 487 is substantially similar to lowpass filter 127 and/or highpass filter 137. However, bandpass filter 487 is configured to remove noise above and/or below the crossover frequencies, or within a threshold thereof, for the mid-frequency channel 480. Accordingly, the bandpass filter 487 removes both high frequency noise and low frequency noise while allowing the mid-frequency signal band to propagate along the mid-frequency channel 180. The mid-frequency signal band output from the mid-frequency channel 480 is combined with the high frequency signal band and the low frequency signal band by a sum block 460, which is similar to sum block 160. The sum block 460 outputs the re-combined signal 470. The resulting re-combined signal 470 is de-embedded by a de-embedding filter 461 controlled by an de-embed control module 453 in a controller 450, based on S-parameters 455. Such components are substantially similar to the de-embedding filter 161, the de-embed control module 153, the controller 150, and the S-parameters 155, respectively. The S-parameters 455 may further include S-parameters for mid-frequency channel 480 and associated components. This allows the de-embed control module 453 to de-embed the phase and magnitude effects caused by the mid-frequency channel 480, or any individual components, or combination of individual components, thereof.

The controller 450 is communicatively coupled to the amplifiers and scaling components of each of the frequency channels 420, 430, and 480 as shown by labels A, C, and B, respectively. The controller 450 is also coupled to the output of each of the filters for each of the channels as shown by labels D, E, and F, respectively. The controller may further include a gain control module 451, which is substantially similar to gain control module 151. However, gain control module 451 is further configured to adjust the amplifier 481 and the scaling component 489 for the mid-frequency channel 480. For example, the gain control module 451 may set a gain boost (e.g. a third gain boost) for the amplifier 481 based on the mid-frequency signal band received via the bandpass filter 487 of the mid-frequency channel 480. The gain boost for the mid-frequency channel 480 may be set independently of the gain boosts set for the low frequency channel 420 and high frequency channel 430.

It should be noted that additional channels may be added to split the signal 470 into further bands as desired. Further splits may be accomplished by adding more cross-over frequencies to the multiplexer and additional mid-frequency channels with corresponding frequency bounds. Further, the gain control 451 module may be further configured to control gain boosts for each channel independently, allowing for targeted noise reduction in particular frequency bands as needed.

Figure 5:
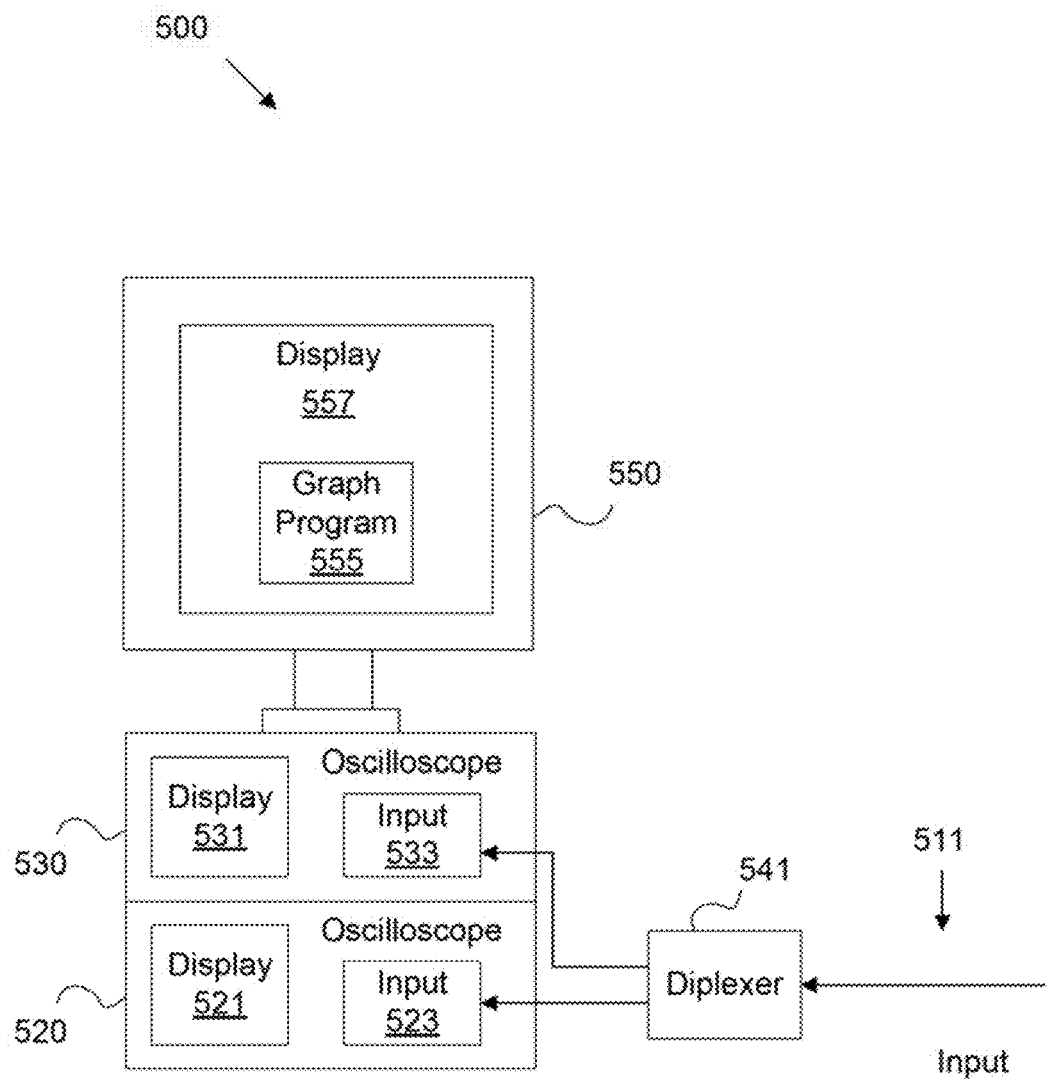
FIG. 5 is an illustrative system level block diagram of a test and measurement system employing noise reduction in accordance with various aspects of the present disclosure.

FIG. 5 is a system level block diagram of an embodiment of a test and measurement system 500 for noise reduction. System 500 may be employed to implement system 100. System 500 includes a first oscilloscope 520 and a second oscilloscope 530. An oscilloscope 520 and/or 530 is a device for capturing waveforms of a signal and viewing such waveforms on a display screen. Oscilloscope 520 and oscilloscope 530 each include displays 521 and 531, respectively, and inputs 523 and 533, respectively. Display 521 is configured to display a waveform, in either the time domain or frequency domain, that describes an electrical signal received via input 523. Input 523 may be any signal communication port, such as coaxial port, a universal serial bus (USB) port, etc. Display 531 and input 533 may be substantially similar to display 521 and input 523, respectively. Each oscilloscope may contain an oscilloscope channel, which may be configured as a high frequency channel or a low frequency channel, as described above. For example, oscilloscope 530 may contain a high frequency channel 130 and oscilloscope 520 may contain a low frequency channel 120, or vice versa. In some embodiments, oscilloscopes 520 and 530 are identical and the selection as a high frequency or low frequency channel is dependent on wiring configuration between the oscilloscopes 520 and 530 and a diplexer 541. In other embodiments, oscilloscopes 520 and 530 may be different from one another and can be selected based on the frequency band being processed. In some embodiments, a third oscilloscope may be added for a mid-frequency channel and a triplexer may be employed instead of diplexer 541 to implement system 400.

The system 500 also includes the diplexer 541, which is substantially similar to diplexer 141. The diplexer 541 receives an input signal 511, which is similar to signal 170, and splits the signal into bands based on frequency. Displays 521 and 531 may be configured to display the signal bands to the user or may be disabled in some configurations. The signal bands are conditioned to reduce noise, as discussed above, and converted into digital waveforms via sampling by the corresponding oscilloscopes 520 and 530. The system 500 may further comprise a computer 550 coupled to the oscilloscopes 520 and 530. The computer 550 may be a computer with memory, processors, a display 557 for displaying waveforms, communication ports, etc. In some embodiments, the computer 550 is specially configured (e.g., via software, hardware, or any combination thereof) to act as a controller, such as controller 150. In some embodiments, functions of the controller are shared between the computer 550 and oscilloscopes 520 and/or 530. The computer 550 and/or oscilloscopes 520/530 may receive each signal band, send commands to the oscilloscopes 520 and 530 channels to set/adjust amplifiers and scaling components as discussed above, apply a de-embedding filter, such as de-embed filter 161, and store waveform samples into memory. A graph program 555 may be executed by a processor to obtain the stored waveform samples and graph such samples on the display 557 (e.g., via a rasterizer) for final review by a user. Accordingly, system 500 provides an embodiment where a high frequency oscilloscope channel is included in a first oscilloscope (e.g. oscilloscope 520) and a low frequency oscilloscope channel is included in a second oscilloscope (e.g. oscilloscope 520).

Figure 6:
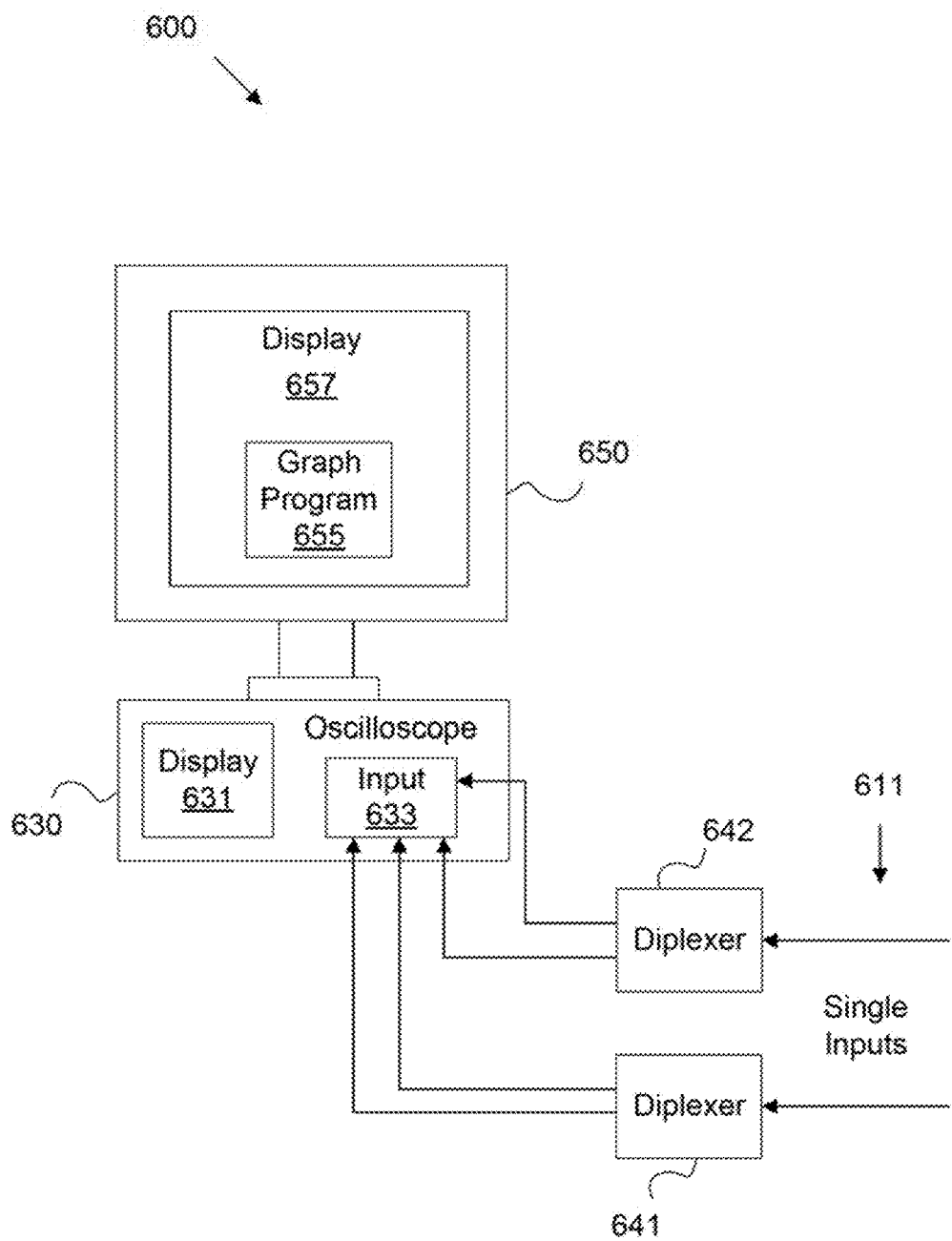
FIG. 6 is an illustrative system level block diagram of a test and measurement system employing noise reduction in accordance with various aspects of the present disclosure for multiple signals in a single oscilloscope.

FIG. 6 is a system level block diagram of an embodiment of a test and measurement system 600 for noise reduction for multiple signals in a single oscilloscope 630. System 600 may be employed to implement system 100, 300, and/or 400. System 600 includes a pair of diplexers 641 and 642, which are substantially similar to diplexers 341 and 342, respectively. System 600 also includes an oscilloscope 630 with a display 631 and an input 633, which are substantially similar to oscilloscope 530, display 531, and input 533, respectively. Oscilloscope 630 may include four channels, such as channels 322, 324, 332, and 334. Hence, oscilloscope 630 can receive signals 611 as two single input signals, such as signal 170, or a differential signal, such as differential signal 374. System 600 also includes a computer 650 with a display 657 and a graph program 655, which are substantially similar to computer 550 display 557, and graph program 555, respectively. Accordingly, computer 650 can act as a controller to control amplifier to increases based on filter output. Computer 650 can also perform de-embedding based on S-parameters and employ graph program 655 to interpret and display waveforms 611 on the display 657. As such, system 600 includes an oscilloscope 630 with each frequency oscilloscope channel implemented in a single oscilloscope. In another embodiment, the oscilloscope 630 can also act as the controller, can perform channel gain control, and signal de-embedding. In such a case, the processed waveform is forwarded to computer 650 for display or displayed on display 631. Further, system 600 is configured to deskew the two signals 611 received via the single inputs. The signals 611 can also be subtracted from one another via the graph program 655 to generate a measurement of a differential signal for display. It should also be noted that system 600 enables a more robust de-embedding of external components that is possible in embodiments that employ a balun.

Figure 7:
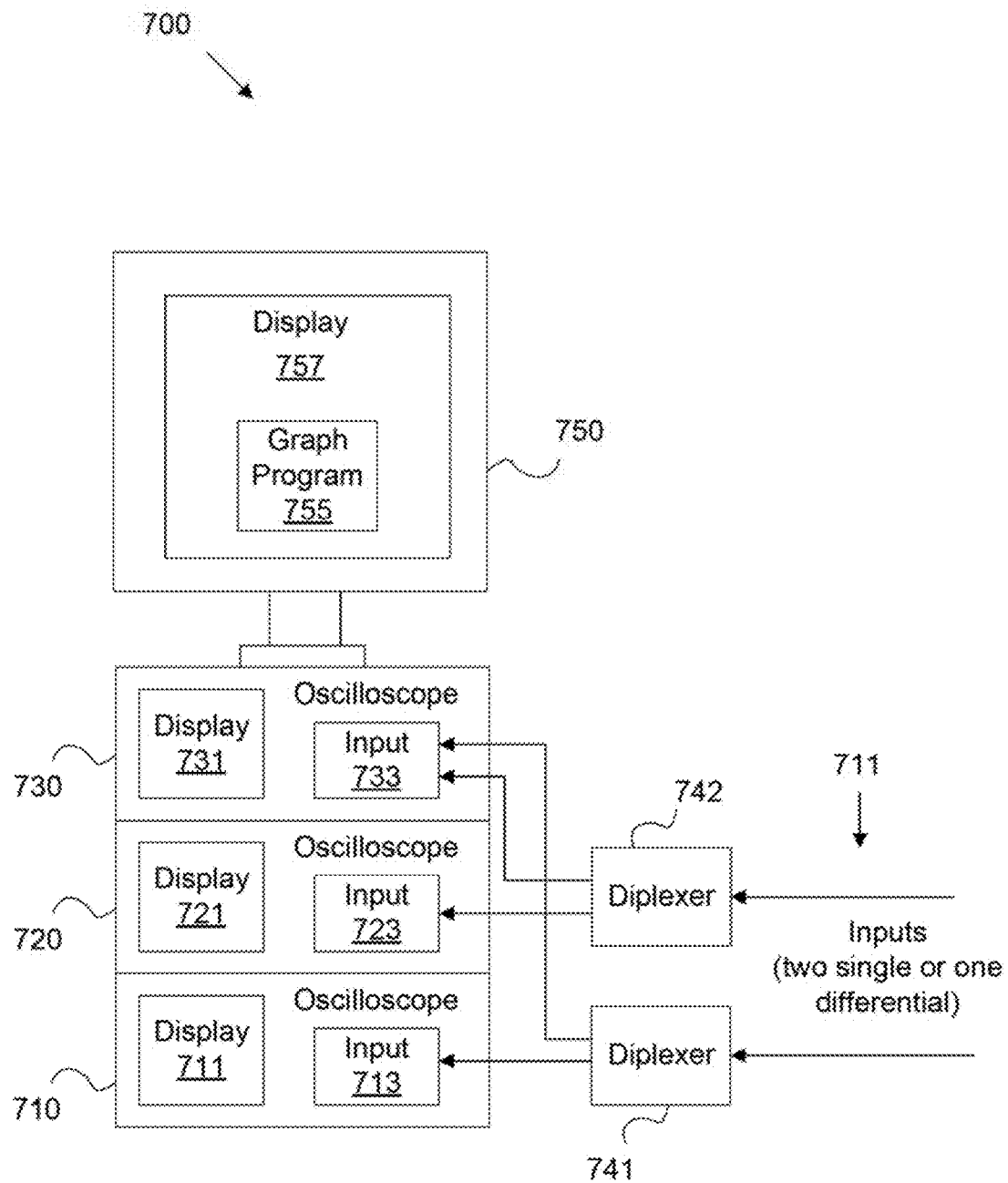
FIG. 7 is an illustrative system level block diagram of a test and measurement system employing noise reduction in accordance with various aspects of the present disclosure for multiple signals or a differential signal.

FIG. 7 is a system level block diagram of an embodiment of a test and measurement system 700 for noise reduction for multiple signals or a differential signal. System 700 may be employed to implement system 100, 300, and/or 400. System 700 includes diplexers 741 and 742, which may be substantially similar to diplexers 641 and 642, respectively. Diplexers 741 and 742 receive signal 711, which can be a differential signal or two related or unrelated individual signals. The system 700 includes an oscilloscope 710 with a display 711 and an input 713, an oscilloscope 720 with a display 721 and an input 723, and an oscilloscope 730 with a display 731 and an input 733, which may be substantially similar to oscilloscope 520, display 521 and input 523, respectively. Oscilloscope 730 may include more complex hardware than oscilloscopes 710 and 720. For example, oscilloscopes 710 and 720 may be capable of processing higher frequency signals than oscilloscope 730. Accordingly, oscilloscope 730 may contain multiple channels and process the low frequency signal band from both diplexers 741 and 742, while higher cost oscilloscopes 720 and 710 process the high frequency signal band from diplexers 742 and 741, respectively. Further, oscilloscopes 720 and 710 may include A/D converters with a higher maximum bandwidth and sample rate than oscilloscope 730. As such, oscilloscopes 720 and 710 can provide an increased SNR for the high frequency signal bands. Accordingly, system 700 provides a lower cost option than some embodiments while providing an increased overall SNR. Both the high frequency band and low frequency band are from the same signal, so their phase response may be determined and the low frequency band sub-sample delay can be computed with respect to the high frequency band sub-sample delay. A FIR filter may be employed to correct the phase response of the low frequency band with respect to the high frequency band when combining the signal bands. Further, the oscilloscopes 710, 720, and 730 may not all be synchronized, but may employ a common trigger. Sub-sample alignment may be performed by a graph program 755 operating on a computer 750 with a display 757, which may be similar to graph program 755, computer 750, and display 757, respectively.

Figure 8:
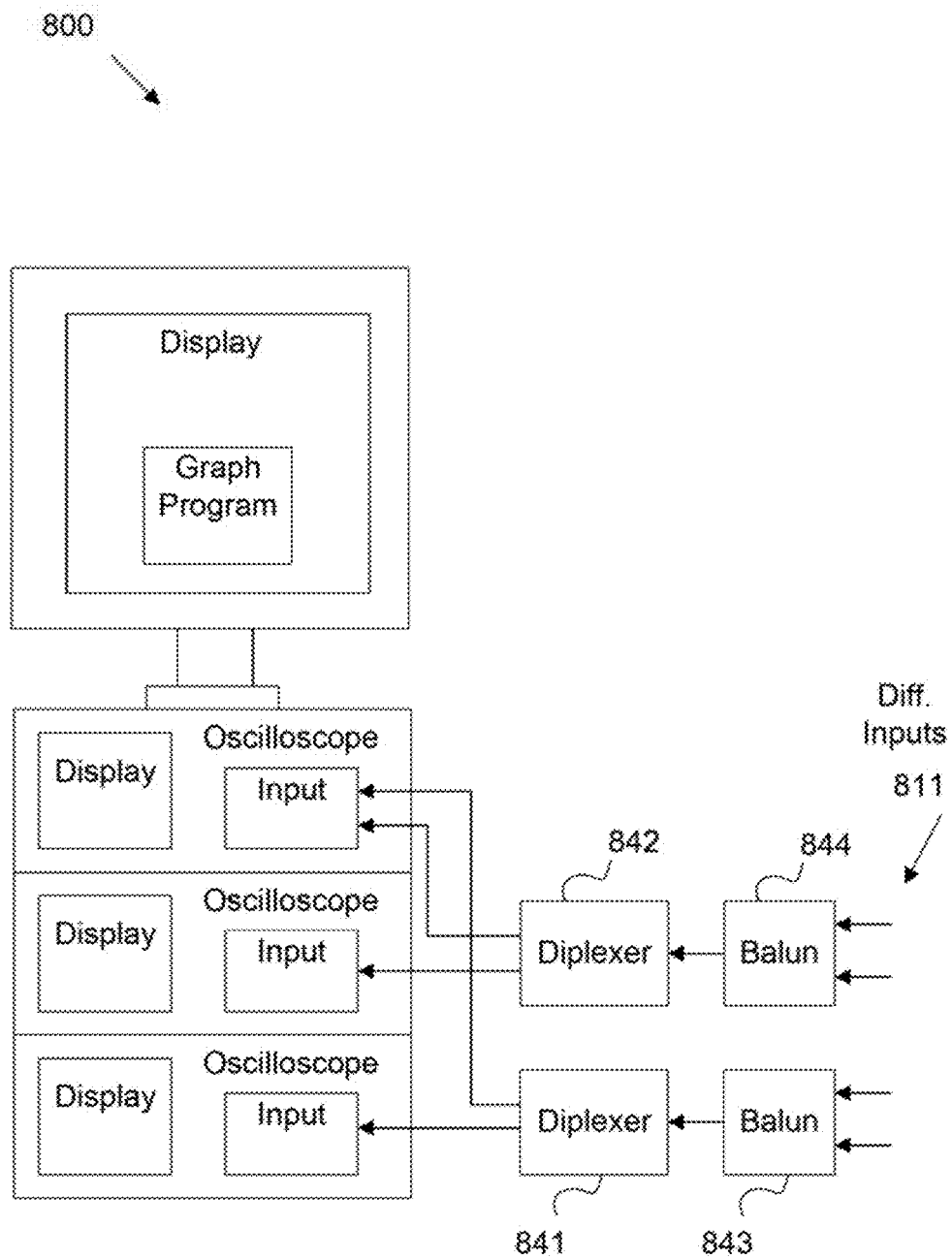
FIG. 8 is an illustrative system level block diagram of a test and measurement system employing noise reduction in accordance with various aspects of the present disclosure for multiple differential signals.

FIG. 8 is a system level block diagram of an embodiment of a test and measurement system 800 for noise reduction for multiple differential signals. System 800 may be substantially similar to system 700. The system 800 may be employed to implement system 200 and/or system 400. The system 800 may employ baluns 843 and 844 coupled to diplexers 841 and 842, respectively. The diplexers 841 and 842 and baluns 843 and 844 may be substantially similar to diplexer 141 and balun 243, respectively. By employing the configuration shown, system 800 can receive and display a pair of differential signals 811 at the cost of a less robust/precise de-embed feature as discussed above. Differential signals 811 may be substantially similar to differential signal 274.

Figure 9:
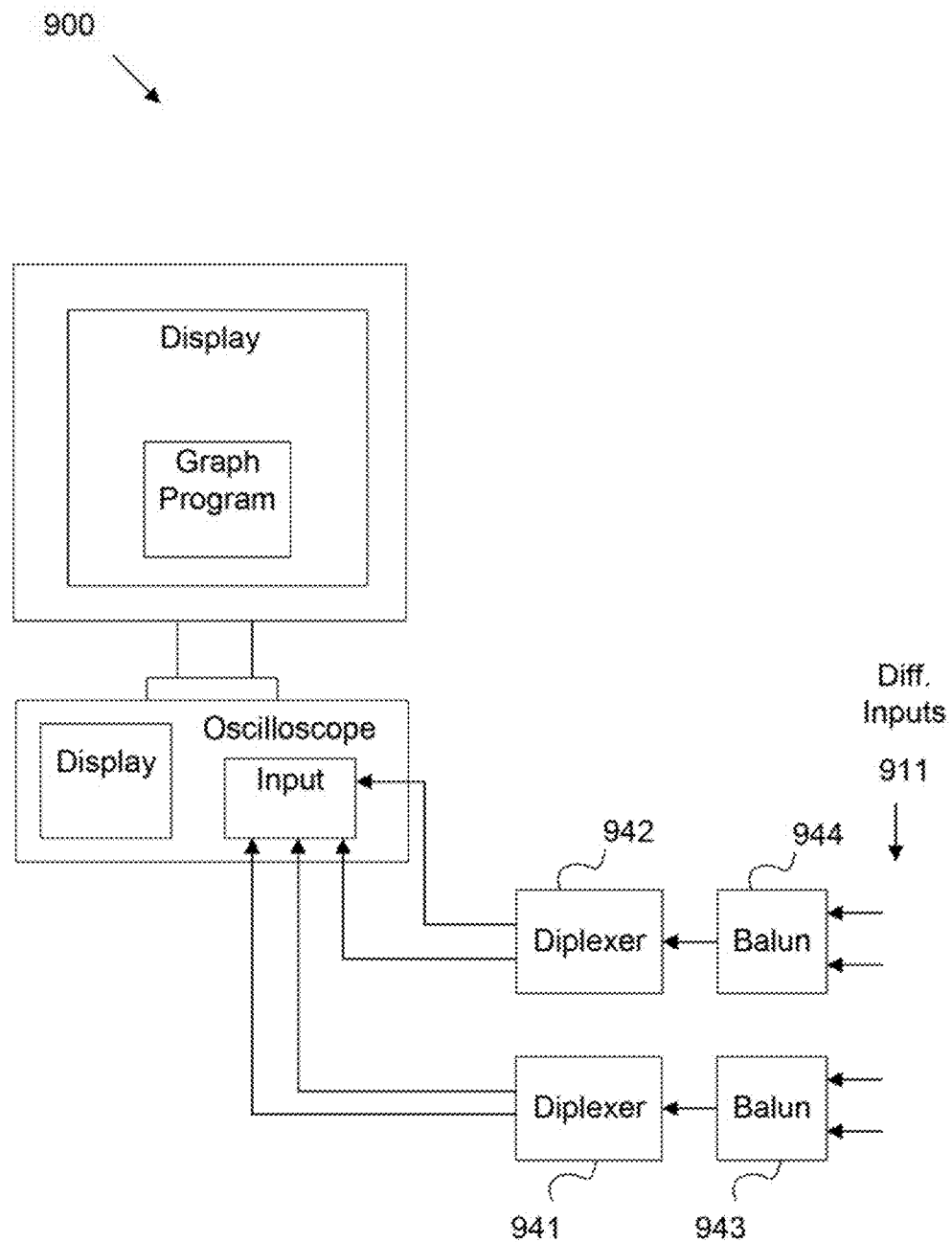
FIG. 9 is an illustrative system level block diagram of a test and measurement system employing noise reduction in accordance with various aspects of the present disclosure for multiple differential signals in a single oscilloscope.

FIG. 9 is a system level block diagram of an embodiment of a test and measurement system 900 for noise reduction for multiple differential signals in a single oscilloscope. The system 900 may be substantially similar to system 600. The system 900 may be employed to implement system 200 and/or 400. The system 900 may employ baluns 943 and 944 coupled to diplexers 941 and 942, respectively. The diplexers 941 and 942 and baluns 943 and 944 may be substantially similar to diplexer 141 and balun 243, respectively. By employing the configuration shown, system 900 can receive and display a pair of differential signals 911 in a single oscilloscope at the cost of a less robust/precise de-embed feature as discussed above. Differential signals 911 may be substantially similar to differential signal 274.

Figure 10:
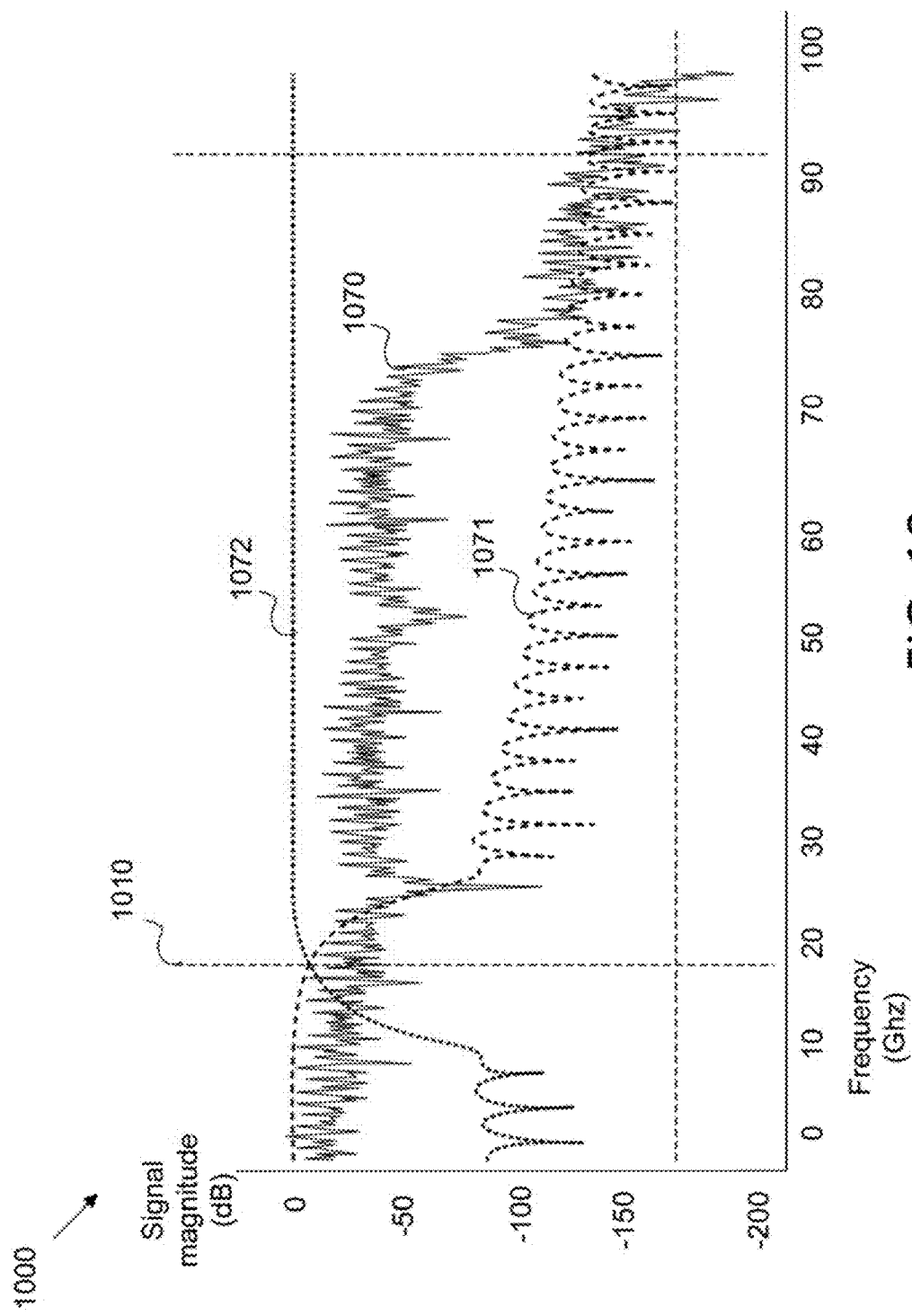
FIG. 10 is an illustrative graph depicting input signals and corresponding output signals in the frequency domain in accordance with various aspects of the present disclosure.

FIG. 10 is a graph 1000 of an embodiment of diplexer input 1070 and corresponding output range in the frequency domain. The diplexer input 1070 is substantially similar to a signal 170 converted by a diplexer 141. The diplexer output includes a low frequency signal band 1071 and a high frequency signal band 1072, which are substantially similar to the low frequency signal band 171 and the high frequency signal band 172, respectively. The diplexer employs a crossover 1010, which is set to about eighteen Gigahertz (Ghz) in the example embodiment. As shown, input 1070 employs a complete signal spectrum. For example, input 1070 may be a pulse amplitude modulation version four (PAM4) spectrum. The bands of the input 1070 with a frequency of less than the crossover 1010 become part of the low frequency signal band 1071, which exhibits low frequency waves but no activity above the crossover 1010. The waves of the input 1070 with a frequency of greater than the crossover 1010 become part of the high frequency signal band 1072, which exhibits high frequency waves but no activity below the crossover 1010.

Figure 11:
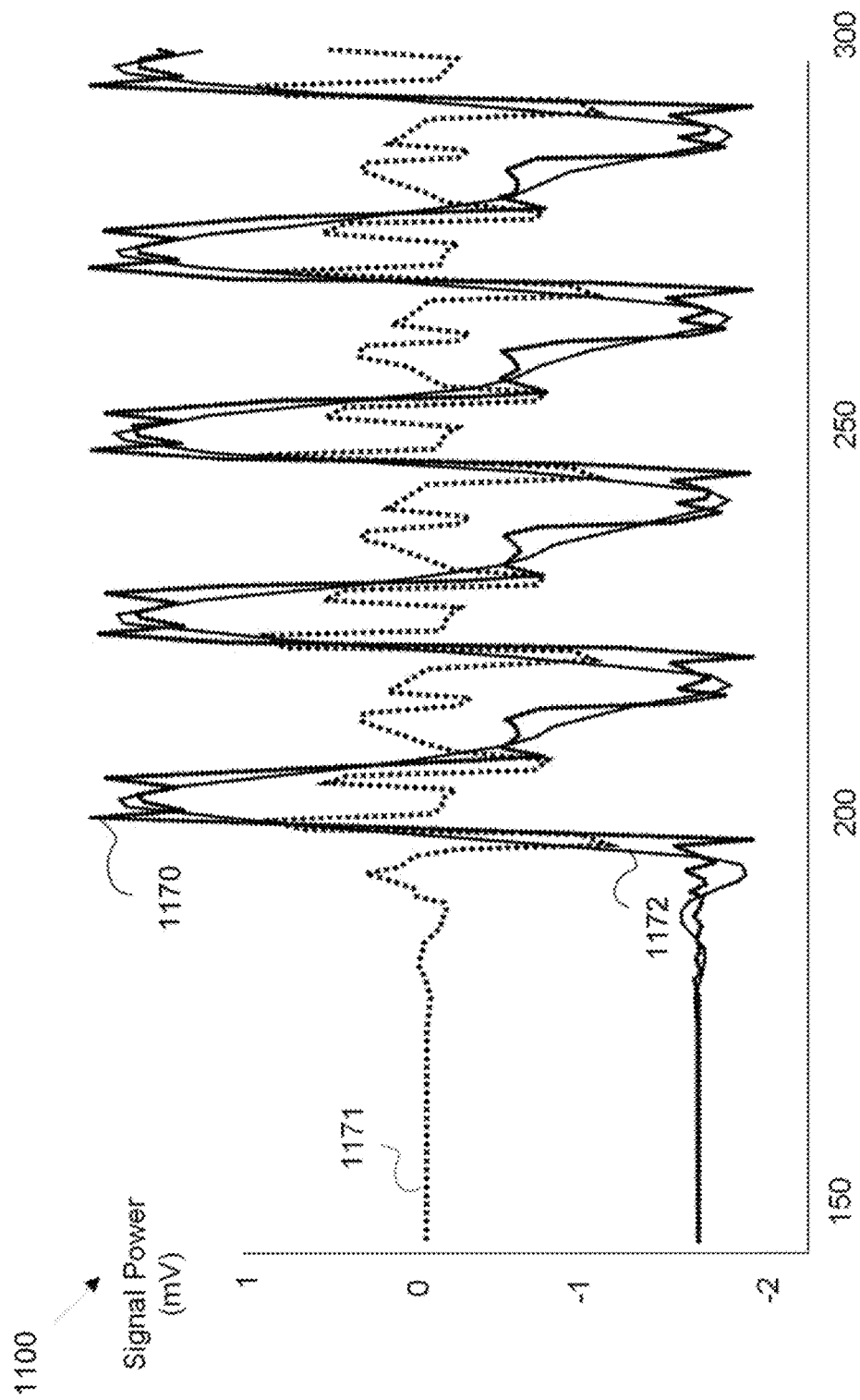
FIG. 11 is an illustrative graph of depicting input signals and corresponding output signals in the time domain in accordance with various aspects of the present disclosure.

FIG. 11 is a graph of an embodiment of diplexer input 1170 and corresponding outputs in the time domain. The diplexer high frequency signal 1171 is substantially similar to a signal 172 converted by a diplexer 141. The diplexer output includes a low frequency signal band 1172 and a high frequency signal band 1171. The low frequency band 1172 is typically similar in amplitude to the input signal 1171. Input 1170 and signal bands 1171 and 1172 are depicted in the time domain as signal amplitude over time. As shown, signal bands 1171 and 1172 contain substantially the same waveform as input 1170 split into multiple waves. As such, signal bands 1171 and 1172 carry the same information as diplexer input 1170. Hence conversion into multiple waveforms based on frequency is reversible without loss of data.

Figure 12:
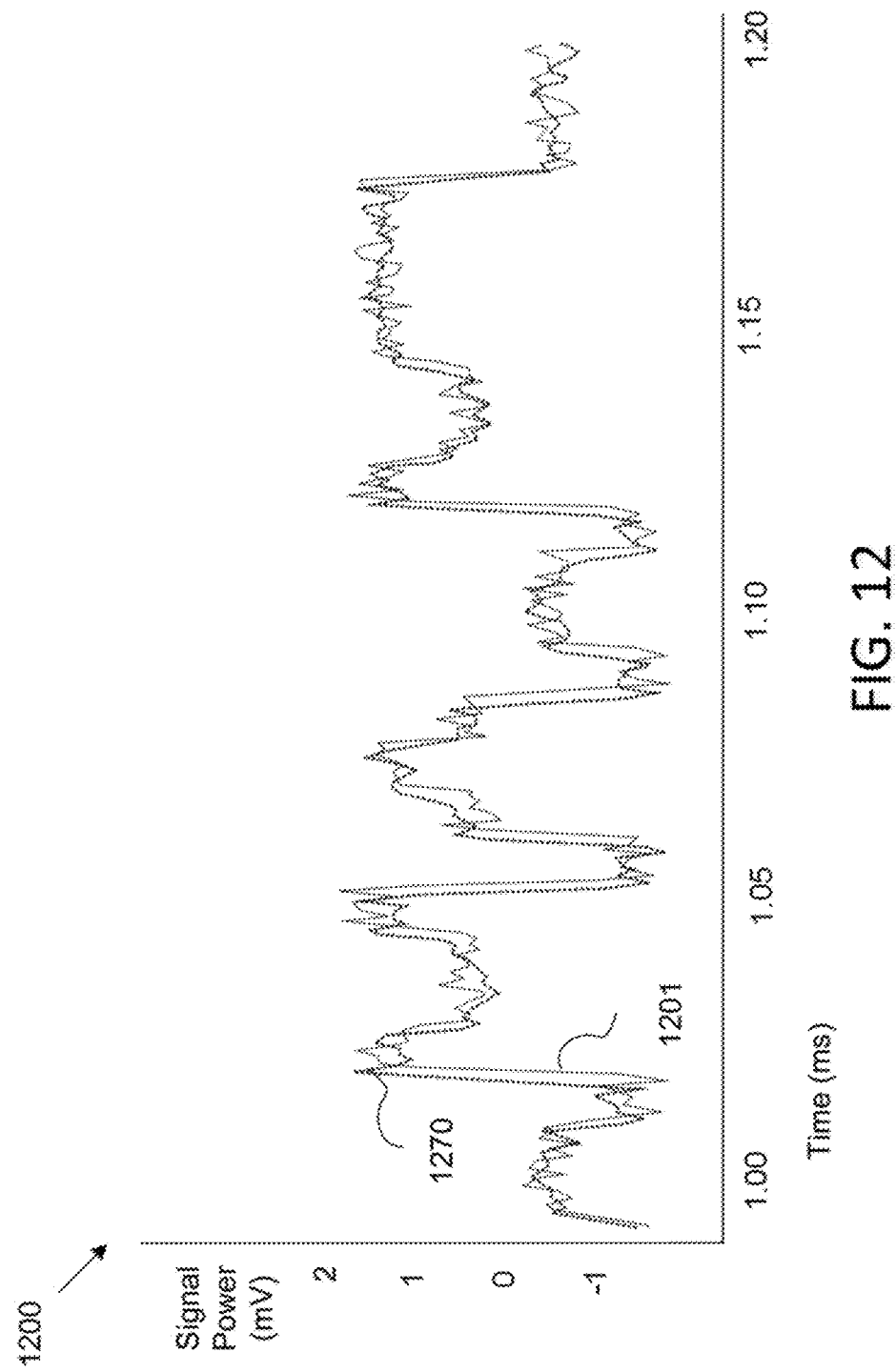
FIG. 12 is an illustrative graph of a waveform processed by a multi-band system in accordance with various aspects of the present disclosure versus a waveform sampled with a single channel.

FIG. 12 is a graph of an embodiment of a waveform 1270 sampled by a multi-band system (e.g., system 100 of FIG. 1), as disclosed above, versus a waveform 1201 sampled with a single channel oscilloscope. As shown, waveform 1270 is smoother than waveform 1201 and hence exhibits less added noise from the oscilloscope channel(s).

Figure 13:
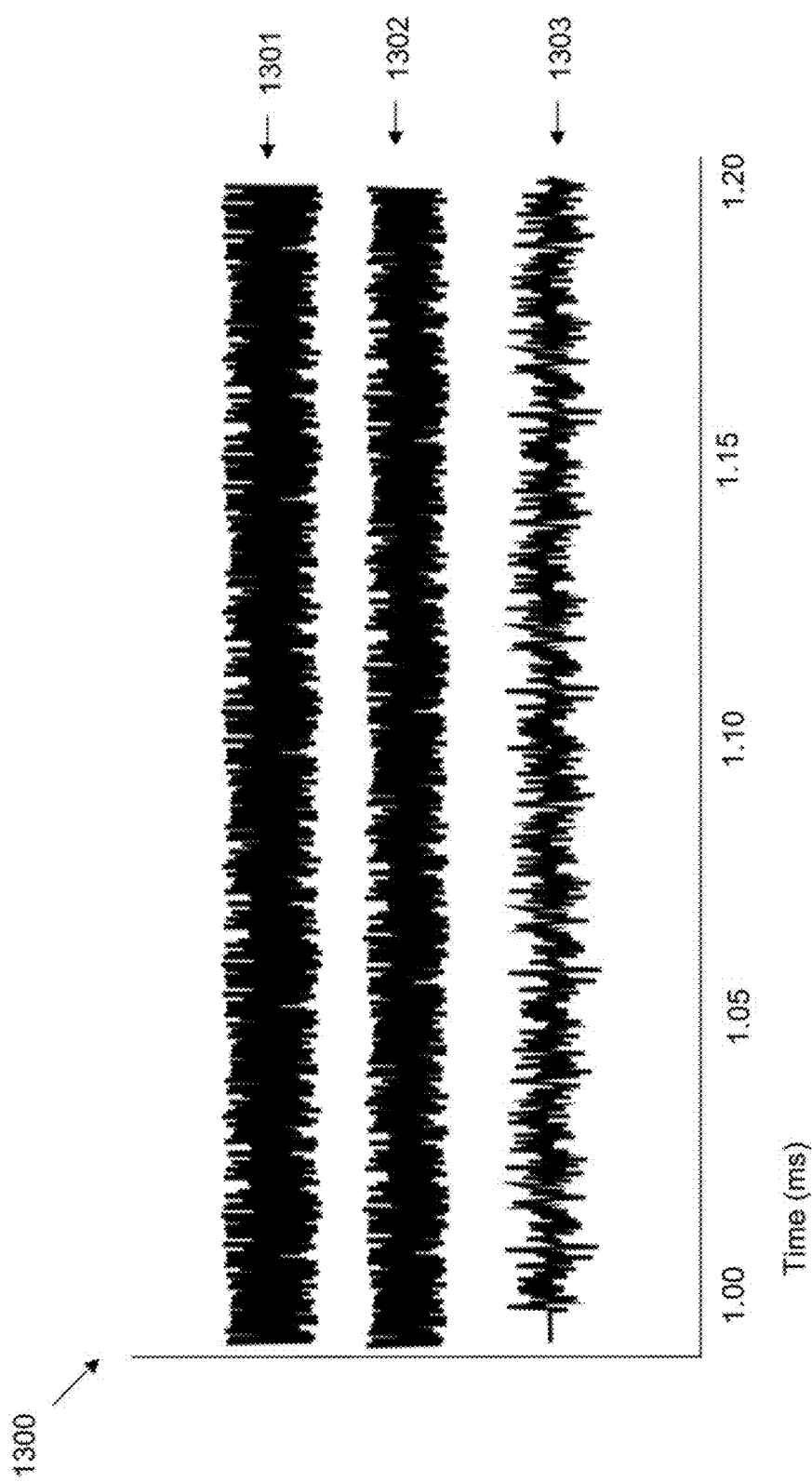
FIG. 13 is a graph of noise reduction in an embodiment of a multi-band system.

FIG. 13 is a graph 1300 of noise reduction in an embodiment of a multi-band system as disclosed above. Noise 1301 illustrates noise occurring in a high frequency oscilloscope channel, noise 1302 illustrates noise occurring in a low frequency oscilloscope channel, and noise 1303 illustrates noise occurring in a final recombined signal after highpass and lowpass filtering. As shown, combined highpass and lowpass filters applied as discussed above result in significantly reduced noise 1303 in the recombined signal.

Figure 14:
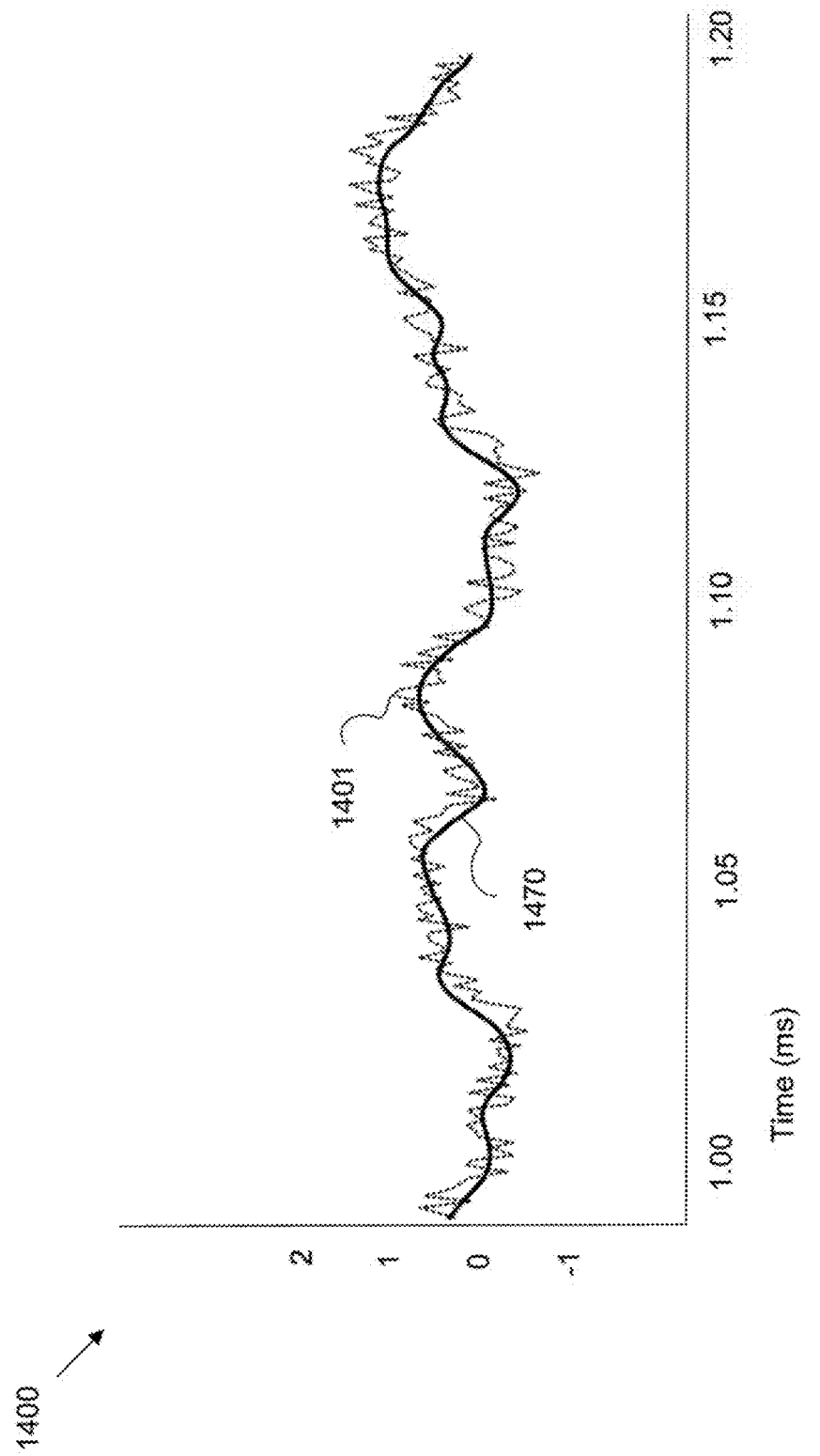
FIG. 14 is a graph of another embodiment of a waveform sampled by a multi-band system compared with a waveform sampled with a single channel.

FIG. 14 is a graph of another embodiment of a waveform 1470 sampled by a multi-band system versus a waveform 1401 sampled with a single channel. As shown, waveform 1470 is smoother than waveform 1401 and hence exhibits less added noise from the oscilloscope channel. For example, a PAM4 signal passed through a lossy channel may result in either waveform 1470 or waveform 1401 depending on system configuration. The waveform 1470 may receive a high frequency band gain boost of about 35 dB without causing clipping at an A/D converter in a multi-band system as discussed in FIGS. 1-4. In such a case, waveform 1470 may experience an 8 dB noise reduction over waveform 1401 generated by an oscilloscope with a single channel.

Figure 15:
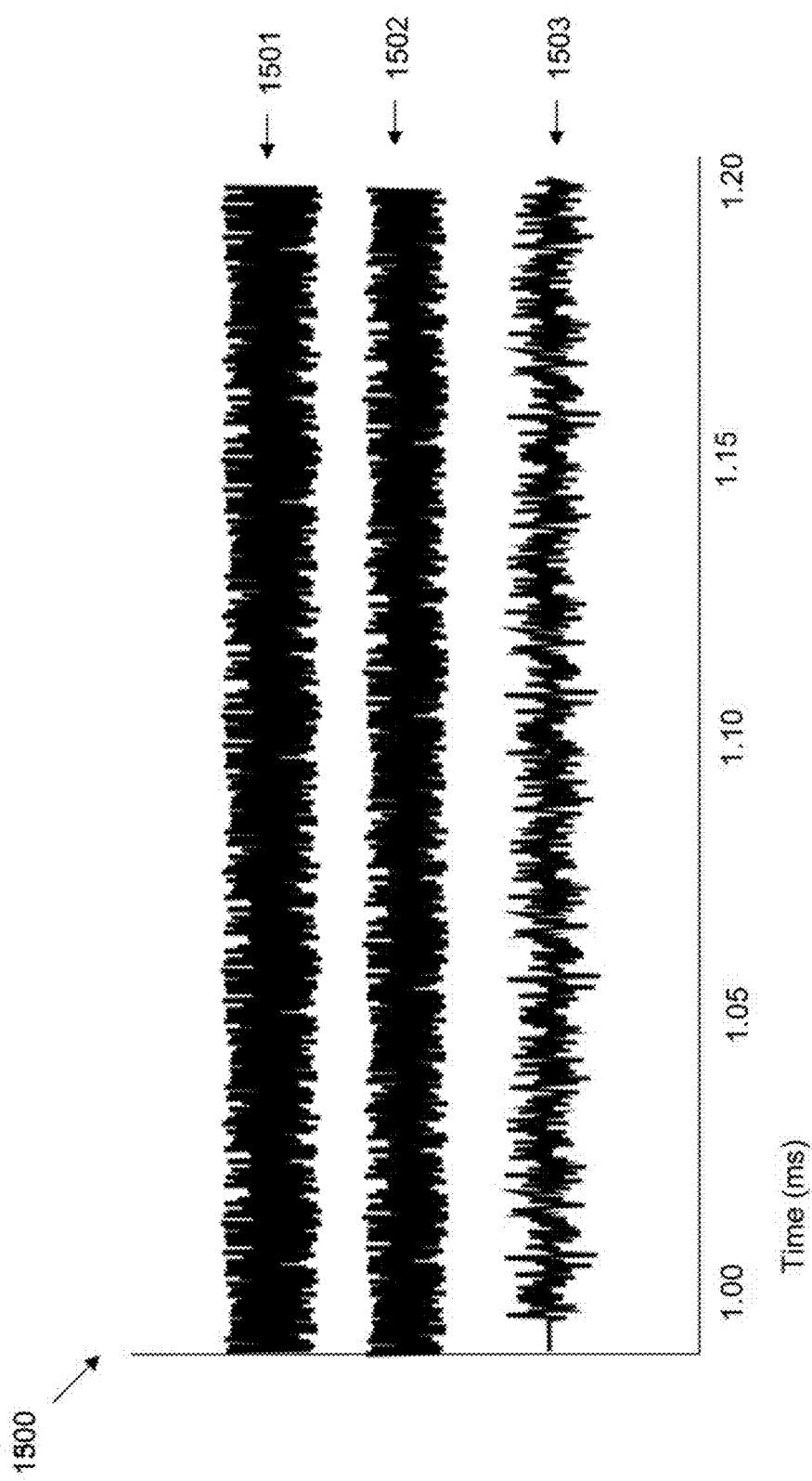
FIG. 15 is an illustrative graph depicting noise reduction in accordance with various aspects of the present disclosure.

FIG. 15 is a graph 1500 of noise reduction in another embodiment of a multi-band system. Noise 1501 illustrates noise occurring in a high frequency oscilloscope channel, noise 1502 illustrates noise occurring in a low frequency oscilloscope channel, and noise 1503 illustrates noise occurring in a final recombined signal similar to waveform 1470. As shown, combined highpass and lowpass filters applied as discussed above result in significantly reduced noise in the recombined signal (e.g. about 8 dB noise reduction).

Figure 16:
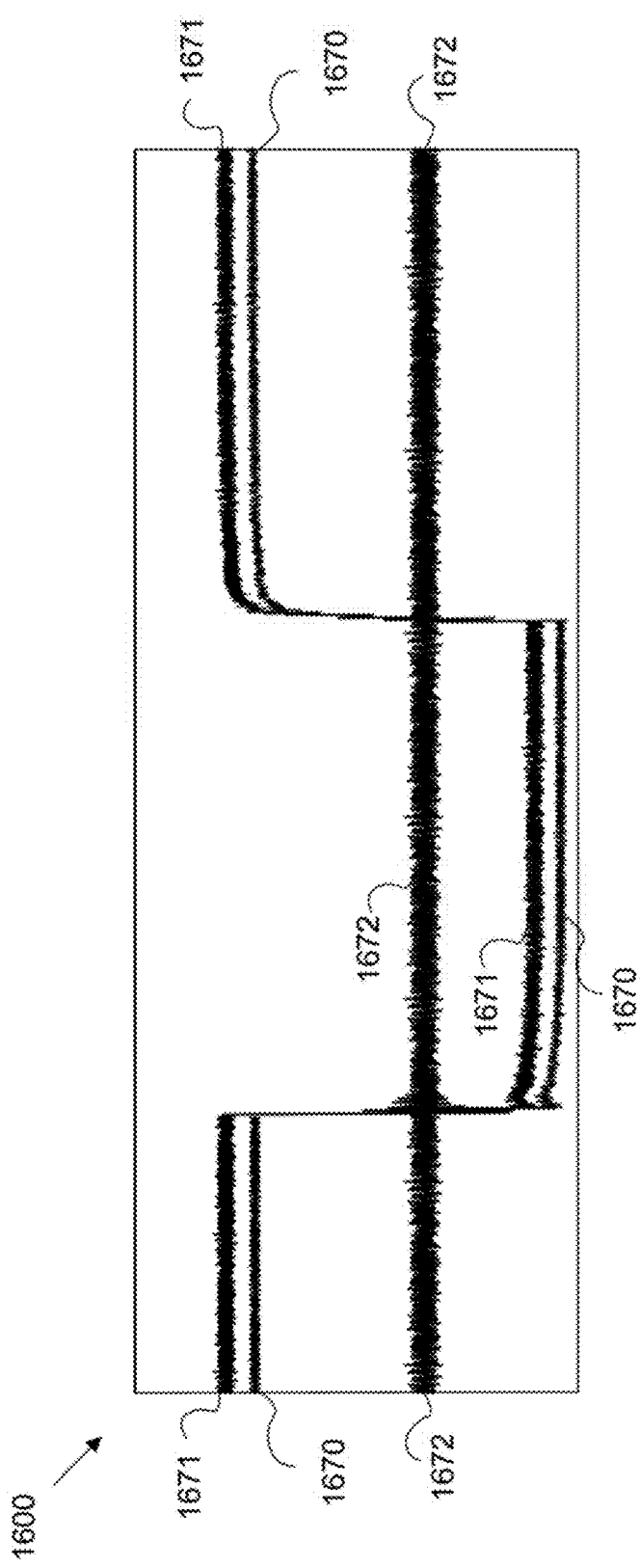
FIG. 16 is an illustrative graph depicting noise reduction as output on an oscilloscope display graticule in accordance with various aspects of the present disclosure.

FIG. 16 is a graph 1600 of noise reduction as output on an oscilloscope display graticule employed as part of a multi-band system, such as systems 100, 200, 300, 400, 500, 600, 700, 800 and/or 900. Graph 1600 is generated by splitting a signal into a high frequency band 1672 and a low frequency band 1671 and forwarding the bands through a pair of oscilloscope channels as discussed above. The reconstructed signal 1670 based on the bands 1671 and 1672 is also shown. The low frequency band 1671 is displayed as a step function, while the high frequency band 1672 is displayed as a ringing pulse. Noise in the reconstructed signal 1670 is reduced by about 4 dB as compared to the low frequency band 1671 and high frequency band 1672. The low frequency band 1671 and the output signal 1670 are graphed with the same vertical scale, such as 100 mV/div, while the high frequency band 1672 is graphed with an expected vertical scale such as 6.25 mV/div. The horizontal scale is time and is the same for all three waveforms.

Figure 17:
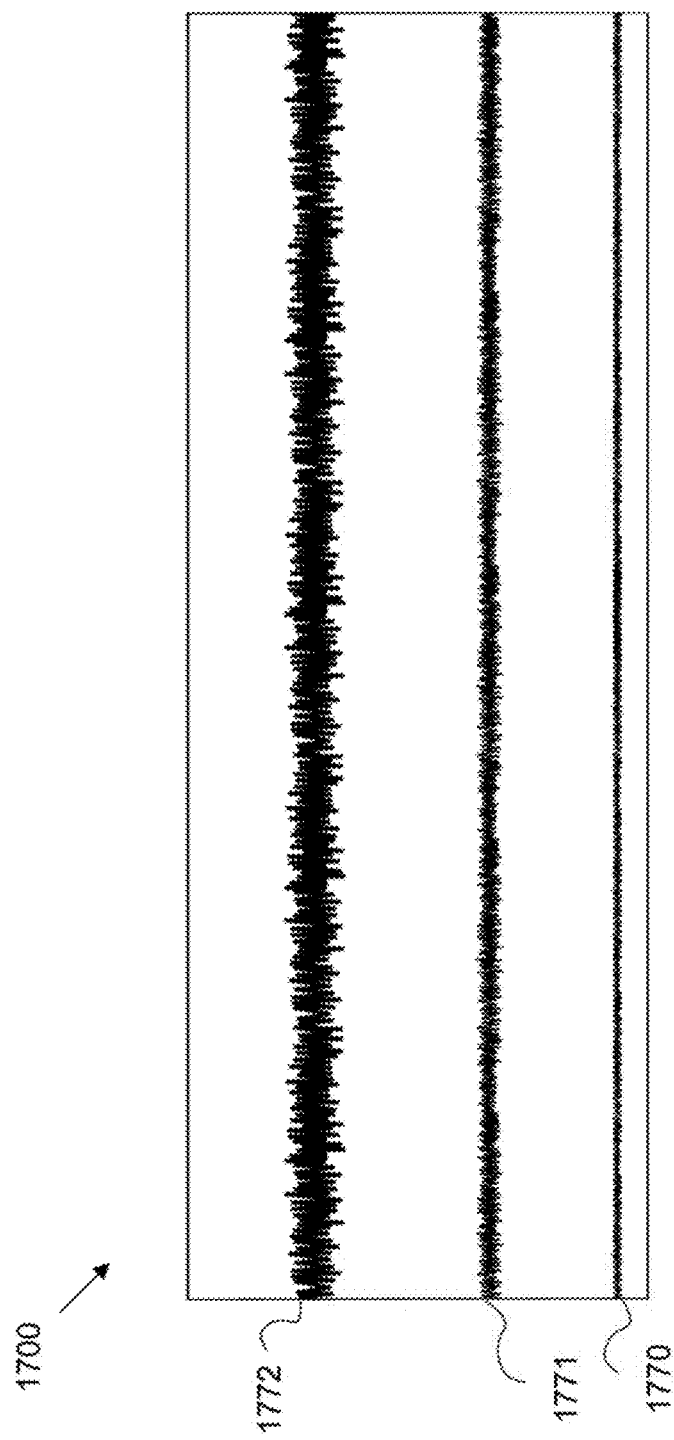
FIG. 17 is an illustrative graph depicting noise reduction as output on an oscilloscope display graticule in accordance with various aspects of the present disclosure.

FIG. 17 is a graph 1700 of noise reduction as output on an oscilloscope display graticule employed as part of a multiband system, such as systems 100, 200, 300, 400, 500, 600, 700, 800 and/or 900. Graph 1700 is generated by showing the noise of a high frequency band 1772 at with a vertical scale of 6.25 mV/div, and the noise of the low frequency band 1771 with a vertical scale of 100 mV/div. The reconstructed signal 1770 with a vertical scale of 100 mV/div is based on the bands 1771 and 1772 is also shown. In the configuration employed to generate graph 1700, noise in the reconstructed signal 1670 is reduced by about 5.8 dB as compared to the low frequency band 1771.

Figure 18:
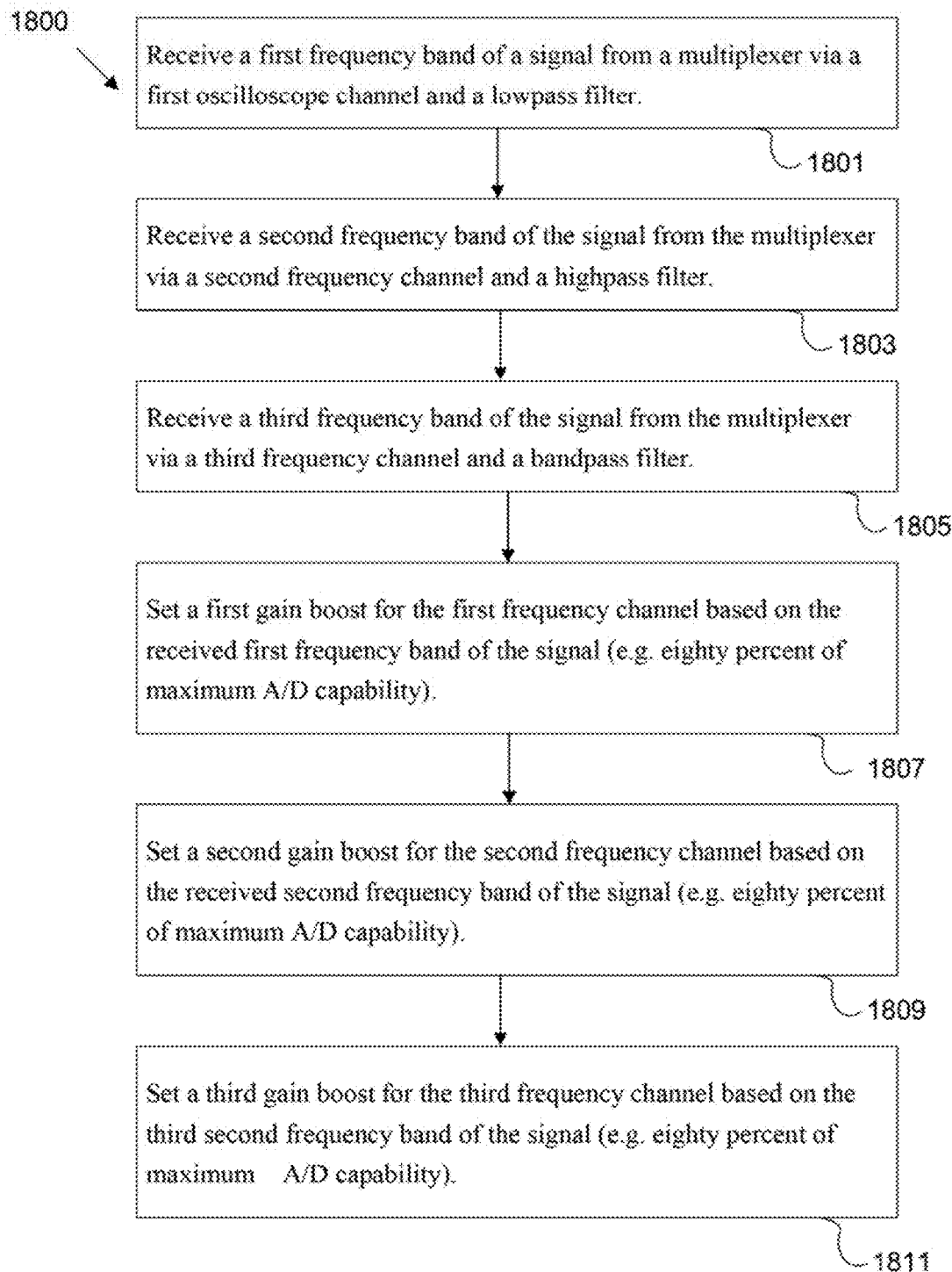
FIG. 18 is an illustrative flow chart of a method of controlling a multi-band system in accordance with various aspects of the present disclosure.

FIG. 18 is a flow chart of an embodiment of a method 1800 of controlling a multi-band system, such as system 100, 200, 300, 400, 500, 600, 700, 800 and/or 900. For example, method 1800 may be implemented in a controller, for example, via one or more machine-readable media storing instructions, which, when executed by a processor of the controller, perform the method 1800. Method 1800 can be implemented to control a high frequency oscilloscope channel, a low frequency oscilloscope channel, and/or one or more mid-frequency channels. At block 1801, a first frequency band of a signal, such as a low frequency band, is received from a multiplexer. The first frequency band is forwarded through a first frequency oscilloscope channel (e.g. a low frequency oscilloscope channel) and received at the controller via a lowpass filter. At block 1803, a second frequency band of the signal, such as a high frequency band, is received from the multiplexer. The second frequency band is forwarded through a second frequency oscilloscope channel (e.g. a high frequency oscilloscope channel) and received at the controller via a highpass filter. At block 1805 a third frequency band of the signal, such as a mid-frequency band, is received from the multiplexer. The third frequency band is forwarded through a third frequency oscilloscope channel (e.g. a mid-frequency oscilloscope channel) and received at the controller via a bandpass filter. It should be noted that block 1805 is optional, and is omitted in embodiments where only two frequency oscilloscope channels are employed. Further, a signal may be sub-divided into additional signal bands based on frequency (e.g. fourth frequency band, fifth frequency band, etc.) by repeating block 1805 as desired on additional oscilloscope channels.

At block 1807, a first gain boost is set for the first low frequency oscilloscope channel. The first gain boost is set based on the first frequency band of the signal received at block 1801. For example, the controller may determine a gain boost that would set the received first frequency band of the signal to about eighty percent of the maximum capability of the A/D converter in the first frequency oscilloscope channel. By setting the gain boost to eighty percent of capacity, the first frequency band is provided twenty percent of A/D capacity as headroom to allow signal variance without clipping at the A/D converter. As such, the selected gain boost may be considered an optimal, or near optimal, gain boost as the selected gain boost provides a largest SNR without clipping. Hence, the first gain boost is selected based on a first signal to noise ratio (SNR) of the first frequency band of the signal attainable without clipping in the first frequency oscilloscope channel. Further, the lowpass filter in the first frequency oscilloscope channel removes high frequency noise (e.g., noise outside the first frequency band) and hence reduces noise added to the first frequency oscilloscope channel. In some instances, the low-pass filter can be configured to remove all, or substantially all, high frequency noise added to the first frequency oscilloscope channel.

At block 1809, a second gain boost is set for the second frequency oscilloscope channel. The second gain boost is set based on the second frequency band of the signal received at block 1803. As with block 1807, the second gain boost may be selected to set the received second frequency band of the signal to about eighty percent of the maximum capability of the A/D converter in the second frequency oscilloscope channel. Hence, the second gain boost is selected based on a second SNR of the second frequency band of the signal attainable without clipping in the second frequency oscilloscope channel by the A/D converter. Further, the highpass filter in the second frequency oscilloscope channel removes low frequency noise and hence reduces noise added to the second frequency oscilloscope channel. In some instances, the highpass filter can be configured to remove all, or substantially all, low frequency noise added to the second frequency oscilloscope channel. As the second gain boost is set based on the second frequency band, the second gain boost is set independently of the first gain boost settings, and vice versa.

Block 1811 is optional, and is only employed in embodiments with three or more oscilloscope channels. Further, block 1811 can be repeated as necessary on additional oscilloscope channels for additional signal frequency bands (e.g. fourth frequency band, fifth frequency band, etc.) At block 1811 a third gain boost is set for the third frequency oscilloscope channel. The third gain boost is set based on the third frequency band of the signal received at optional block 1805. As with blocks 1807 and 1809, the third gain boost may be selected to set the received third frequency band of the signal to about eighty percent of the maximum capability of the A/D converter in the third frequency oscilloscope channel. Hence, the third gain boost is selected based on a third SNR of the third frequency band of the signal attainable without clipping in the third frequency oscilloscope channel by the A/D converter. Further, the bandpass filter in the third frequency oscilloscope channel removes noise with frequencies outside the bandpass frequency range and hence reduces noise added to the third frequency oscilloscope channel. As the third gain boost is set based on the third frequency band, the third gain boost is set independently of the first gain boost, second gain boost, and vice versa.

Method 1800 may be implemented to occur when a user switches to a new signal and initiates optimization through a menu. Method 1800 may also be implemented to occur between each signal acquisition. Method 1800 may also be implemented to occur between each acquisition, but only upon user approval via a pop-up menu. Method 1800 may also be implemented by manual control of the corresponding amplifiers via user inputs.

It should also be noted that the frequency bounds for the high frequency band, low frequency band, and/or mid-frequency band may vary depending on the embodiment. The signal is split into the various bands by the multiplexer. Hence, crossover frequencies/threshold(s) of the multiplexer determine frequency bounds for the low frequency oscilloscope channel, the mid-frequency oscilloscope channel, high frequency oscilloscope channel, and/or corresponding signal bands.

Figure 19:
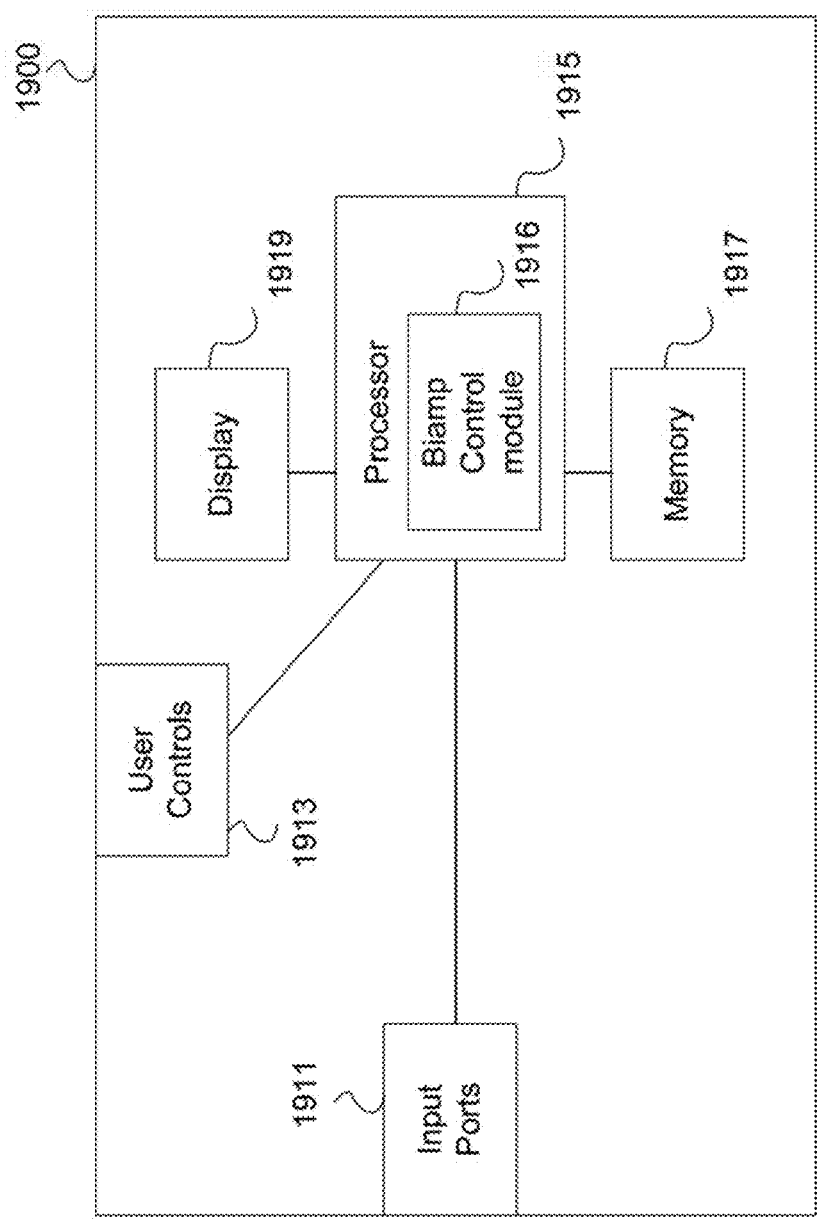
FIG. 19 is an illustrative apparatus in accordance with various aspects of the present disclosure.

FIG. 19 is an embodiment of an apparatus 1900 configured to act in a test and measurement system, such as oscilloscope 520, 530, 630, 710, 720, 730, 810, 820, 830, and/or 930 or a computer such as computer 550, 650, 750, 850, and/or 950. Apparatus 1900 may also be configured to implement method 1800 and/or any other method disclosed herein. Apparatus 1900 comprises signal input ports 1911 which may be any electrical and/or optical ports, receivers, etc. configured to accept an input signal for testing purposes. Input ports 1911 are coupled to additional circuitry. For example, when acting as an oscilloscope, apparatus 1900 may comprise one or more oscilloscope channels as discussed with respect to FIGS. 1-4. In such embodiments, the apparatus may also include various signal analysis circuits such as amplifiers, samplers, phase reference circuits, clock recovery circuits, interpolators, and/or other components for signal sampling and/or signal conditioning. Input ports 1911 may be further coupled to a processor 1915 and/or memory 1917. The processor 1915 may be implemented as a general purpose processor. Processor 1915 is configured to execute instructions from memory 1917 and perform any methods and/or associated steps indicated by the instructions. Memory 1917 may be implemented as processor cache, random access memory (RAM), read only memory (ROM), solid state memory, hard disk drive(s), or any other memory type or machine-readable storage media. Memory 1917 acts as a non-transitory medium for storing data, computer program products, and other instructions, and providing such data/products/instruction to the processor 1915 for computation as needed.

Processor 1915 may comprise a multi-band control module 1916. The multi-band control module 1916 is a processing circuit and/or set of instructions configured to set gain boosts for adjustable amplifiers to reduce noise based on output from filters. Multi-band control module 1916 is further configured to perform method 1800 and any other method disclosed herein. In some embodiments, the multi-band control module 1916 may also be implemented, in whole or in part, in the memory 1917, user controls 1913, and/or display 1919. User controls 1913 are coupled to the processor 1915. User controls 1913 may comprise strobe inputs, gain controls, triggers, display adjustments, power controls, or any other controls employable by a user to display or alter a display of an input signal on display 1919. Display 1919 may be a digital screen or a cathode ray tube based display. Display 1919 comprises a plurality of graticules for displaying corresponding input signals, for example as eye diagrams.

Embodiments of the invention may operate on a particularly created hardware, on firmware, digital signal processors, or on a specially programmed general purpose computer including a processor operating according to programmed instructions. The terms "controller" or "processor" as used herein are intended to include, but are not limited to, microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

While described above predominantly in reference to a test and measurement system, and in particular oscilloscopes, it will be appreciated that embodiments of this disclosure can be implemented in any number of other test and measurement instruments or electronic devices where noise in a digitized signal may be an issue. In some instances, the embodiment may take the form of an analog to digital converter (ADC) that is configured to process signals as described herein. In such embodiments, the possible implementations of this disclosure may include any situation where an ADC is utilized, especially those instances where noise in the digital signal produced by the ADC is of concern. I addition, in an ADC configuration, the components depicted above as being separate from the ADC may actually be integrated into the ADC (e.g., multiplexers, amplifiers, combiners/summers, filters, controllers, or any subset thereof).

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific embodiments described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects, or subsets thereof, may also be implemented as instructions carried by or stored on one or more transitory or non-transitory machine-readable (e.g., computer-readable) medium, which may be read and executed by one or more processors. Such instructions may be referred to as a computer program product.

Computer-readable media, or machine-readable media, can be any available media, or any combination thereof, that can be accessed by a computing device and includes both volatile and nonvolatile media, removable and non-removable media. By way of example, and not limitation, computer-readable media may comprise computer storage media and communication media.

Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computing device. Computer storage media excludes signals per se and transitory forms of signal transmission.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

We claim:

1. An apparatus comprising:
   an amplifier configured to receive a first frequency band of an analog signal and apply a gain to the first frequency band, the first frequency band having a first range of frequencies;
   a first analog-to-digital converter, coupled with an output of the amplifier, configured to convert the first frequency band of the analog signal to a first digital signal;
   a second analog-to-digital converter configured to receive a second frequency band of the analog signal and convert the second frequency band to a second digital signal, the second frequency band having a second range of frequencies different from the first range of frequencies;
   a gain controller configured to adjust the gain of the amplifier based on the first digital signal to increase a signal-to-noise ratio of the first digital signal; and
   a de-embed controller configured to generate a correction filter to remove an effect of the amplifier from the first digital signal; and
   a sum block, coupled with an output of the first analog-to-digital converter and an output of the second analog-to-digital converter, configured to:
   combine the first digital signal and the second digital signal into an output signal that is a digital representation of the analog signal, and
   output the output signal for additional processing.

2. The apparatus of claim 1, further comprising:
   a first noise filter configured to remove noise from the first digital signal that is outside the first frequency band; and
   a second noise filter configured to remove noise from the second digital signal that is outside the second frequency band.

3. The apparatus of claim 2, further comprising a multiplexer configured to produce the first frequency band and the second frequency band from the analog signal, and wherein a crossover threshold of the multiplexer determines the first range of frequencies included within the first frequency band and the second range of frequencies included within the second frequency band.

4. The apparatus of claim 1, wherein the gain controller is further configured to set the gain based on a signal to noise ratio of the first digital signal attainable without clipping by the first analog-to-digital converter.

5. The apparatus of claim 1, wherein the gain controller is further configured to:
   increase the gain applied to the first frequency band until clipping by the first analog-to-digital converter is detected; and
   in response to detecting the clipping, decrease the gain until the clipping is no longer detected.

6. The apparatus of claim 1, in which generating the correction filter is based on scattering parameters associated with the amplifier.

7. The apparatus of claim 1, wherein the analog signal is a differential signal.

8. The apparatus of claim 7, further comprising:
   a balun configured to convert the differential signal into a single signal; and
   a multiplexer, coupled with the balun, configured to split the single signal into the first frequency band and the second frequency band.

9. The apparatus of claim 1, wherein the amplifier is a first amplifier the gain is a first gain, and the correction filter is a first correction filter further comprising:
   a second amplifier configured to apply a second gain to the second frequency band of the analog signal;
   wherein the second analog-to-digital converter is coupled with an output of the second amplifier;
   wherein the gain controller is further configured to adjust the gain of the second amplifier based on the second digital signal to increase a signal-to-noise ratio of the second digital signal; and
   wherein the de-embed controller is further configured to generate a second correction filter to remove an effect of the second amplifier from the second digital signal.

10. The apparatus of claim 1, wherein the analog signal is an analog differential signal, the first and second frequency bands are produced from a positive side of the analog differential signal, the sum block is a first sum block, and the output signal is a digital differential signal, further comprising:
    a second amplifier configured to receive a third frequency band of a negative side of the differential signal and apply a gain to the third frequency band;
    a third analog-to-digital converter, coupled with an output of the second amplifier, configured to convert the third frequency band to a third digital signal;

a fourth analog-to-digital converter configured to receive a fourth frequency band of the negative side of the differential signal and convert the fourth frequency band to a fourth digital signal, the fourth frequency band being different from the third frequency band;

a second sum block, coupled with an output of the third analog-to-digital converter and an output of the fourth analog-to-digital converter, configured to:

combine the third digital signal and the fourth digital signal into a negative side of the output signal that is a digital representation of the negative side of the analog signal, wherein the first sum block combines the first digital signal and the second digital signal into a positive side of the output signal, and output the output signal for additional processing; and wherein the gain controller is further configured to adjust the gain of the second amplifier based on the third digital signal to increase a signal-to-noise ratio of the third digital signal; and wherein the de-embed controller is further configured to generate a second correction filter to remove an effect of the second amplifier from the third digital signal.

11. A method of reducing noise in a digitizing system comprising:

receiving a first frequency band having a first range of frequencies of an analog signal and a second frequency band having a second range of frequencies of the analog signal, the first range of frequencies and the second range of frequencies being different from one another;

amplifying, via an analog amplifier, the first frequency band and outputting the amplified first frequency band to a first analog-to-digital converter of the digitizing system;

digitizing, via the first analog-to-digital converter, the amplified first frequency band to produce a first digital signal;

digitizing, via a second analog-to-digital converter, the second frequency band to produce a second digital signal;

adjusting a gain of the analog amplifier based on the first digital signal to increase a signal to noise ratio of the first digital signal;

removing an effect of the analog amplifier from the first digital signal;

combining the first digital signal and the second digital signal to produce a digitized signal that is representative of the analog signal; and outputting the digitized signal for additional processing.

12. The method of claim 11, further comprising, prior to the combining:

applying a first noise filter to the first digital signal to remove noise occurring outside the first range of frequencies of the first frequency band; and applying a second noise filter to the second digital signal to remove noise occurring outside the second range of frequencies of the second frequency band.

13. The method of claim 12, wherein a crossover threshold of a multiplexer determines the first range of frequencies of the first frequency band and the second range of frequencies of the second frequency band.

14. The method of claim 13, in which adjusting the gain is based on a signal to noise ratio attainable without clipping by the first analog-to-digital converter.

15. The method of claim 14, wherein adjusting the gain based on the signal to noise ratio attainable without clipping by the first analog-to-digital converter comprises:

increasing the gain of the analog amplifier until clipping by the first analog-to-digital converter is detected; and in response to detecting the clipping, decreasing the gain until the clipping is no longer detected.

16. The method of claim 14, wherein removing an effect of the analog amplifier from the first digital signal comprises:

generating a correction filter based on scattering parameters associated with the analog amplifier; and applying the correction filter to the first digital signal.

17. The method of claim 11, wherein the analog signal is a differential signal.

18. The method of claim 17, further comprising:

converting, via a balun, the differential signal into a single signal; and splitting, via a multiplexer, the single signal into the first frequency band and the second frequency band.

19. The method of claim 11, wherein the analog signal is one of a positive side or a negative side of a differential signal.

20. The method of claim 11, wherein the analog amplifier is a first analog amplifier and the correction filter is a first correction filter further comprising:

amplifying, via a second analog amplifier, the second frequency band of the analog signal, wherein the second analog-to-digital converter is coupled with an output of the second analog amplifier;

adjusting a gain of the second analog amplifier based on the second digital signal to increase a signal-to-noise ratio of the second digital signal; and removing an effect of the second analog amplifier from the second digital signal.

* * * * *